(12) United States Patent
Westphal et al.

(10) Patent No.: US 8,154,368 B2
(45) Date of Patent: Apr. 10, 2012

(54) COMPACT SUPERCONDUCTING MAGNET CONFIGURATION WITH ACTIVE SHIELDING, WHEREIN THE SHIELDING COIL DAMPS THE FIELD MAXIMUM OF THE MAIN COIL AS WELL AS ASSOCIATED MAGNETIC RESONANCE TOMOGRAPH, NMR SPECTROMETER AND ION CYCLOTRON RESONANCE MASS SPECTROMETER

(75) Inventors: Michael Westphal, Offenbach (DE); Gerald Neuberth, Bruchsal (DE)

(73) Assignee: Bruker BioSpin GmbH, Rheinstetten (DE)

( * ) Notice: Subject to any disclaimer, the term of this patent is extended or adjusted under 35 U.S.C. 154(b) by 47 days.

(21) Appl. No.: 12/896,924

(22) Filed: Oct. 4, 2010

(65) Prior Publication Data

US 2011/0080239 A1    Apr. 7, 2011

(30) Foreign Application Priority Data

Oct. 6, 2009 (DE) .......................... 10 2009 045 373

(51) Int. Cl.
*H01F 1/00* (2006.01)
*H01F 7/00* (2006.01)
*H01F 6/00* (2006.01)

(52) U.S. Cl. ........ 335/216; 335/299; 335/301; 324/307; 324/318; 324/319; 324/320

(58) Field of Classification Search .................. 335/216, 335/299, 301; 324/307, 318–320
See application file for complete search history.

(56) References Cited

U.S. PATENT DOCUMENTS 5,568,102 A * 10/1996 Dorri et al. .................... 335/216
(Continued)

FOREIGN PATENT DOCUMENTS

EP                0 332 176         9/1989

*Primary Examiner* — Mohamad Musleh
(74) *Attorney, Agent, or Firm* — Paul Vincent

(57) ABSTRACT

An actively shielded superconducting magnet configuration (M1; M2; M3; 14) for generating a homogeneous magnetic field $B_0$ in a volume under investigation (4b) has a radially inner superconducting main field coil (1) which is disposed rotationally symmetrically about an axis (z axis) and a coaxial radially outer superconducting shielding coil (2) which is operated in an opposite direction. The magnet configuration consists of the main field coil, the shielding coil and a ferromagnetic field-shaping device (3; 18), wherein the ferromagnetic field-shaping device is disposed radially inside the main field coil. The main field coil consists of an unstructured solenoid coil or of several radially nested unstructured solenoid coils (15, 16) which are operated in the same direction. An extension $L_{abs}$ of the shielding coil in the axial direction is smaller than the extension $L_{haupt}$ of the main field coil in the axial direction.

$$\left.\frac{d^2}{dz^2} B_{H+A}(z)\right|_{z=0} \leq 0$$

applies for the axial magnetic field profile $B_{H+A}(z)$ generated by the main field coil and the shielding coil during operation along the z-axis in the center at z=0 and $$\left.\frac{d^2}{dz^2} B_F(z)\right|_{z=0} \geq 0$$

applies for the axial magnetic field profile $B_F(z)$ generated by the ferromagnetic field-shaping device (3; 18) during operation along the z-axis in the center at z=0, wherein the z-axis is oriented in a positive direction of the $B_0$-field. An actively shielded superconducting magnet configuration of considerably simplified structure is thereby provided with a homogeneous and particularly high magnetic field $B_0$ in the volume under investigation.

21 Claims, 18 Drawing Sheets

U.S. PATENT DOCUMENTS

| | | | |
|---|---|---|---|
| 5,594,401 A * | 1/1997 | Dorri et al. | 335/216 |
| 5,701,112 A * | 12/1997 | Brown | 335/216 |
| 5,736,859 A * | 4/1998 | Gore | 324/319 |
| 6,265,960 B1 | 7/2001 | Schauwecker | |
| 6,617,853 B2 | 9/2003 | Bovier | |
| 6,897,750 B2 | 5/2005 | Neuberth | |
| 6,909,347 B2 * | 6/2005 | Wakuda et al. | 335/296 |
| 7,224,167 B2 * | 5/2007 | Jarvis et al. | 324/318 |
| 7,365,540 B2 | 4/2008 | Westphal | |
| 2005/0110494 A1 * | 5/2005 | Westphal | 324/318 |
| 2006/0061361 A1 | 3/2006 | Westphal | |
| 2006/0261812 A1 * | 11/2006 | Ariyoshi | 324/318 |
| 2009/0261246 A1 | 10/2009 | Neuberth | |
| 2011/0136671 A1 * | 6/2011 | Citver et al. | 505/163 |

\* cited by examiner

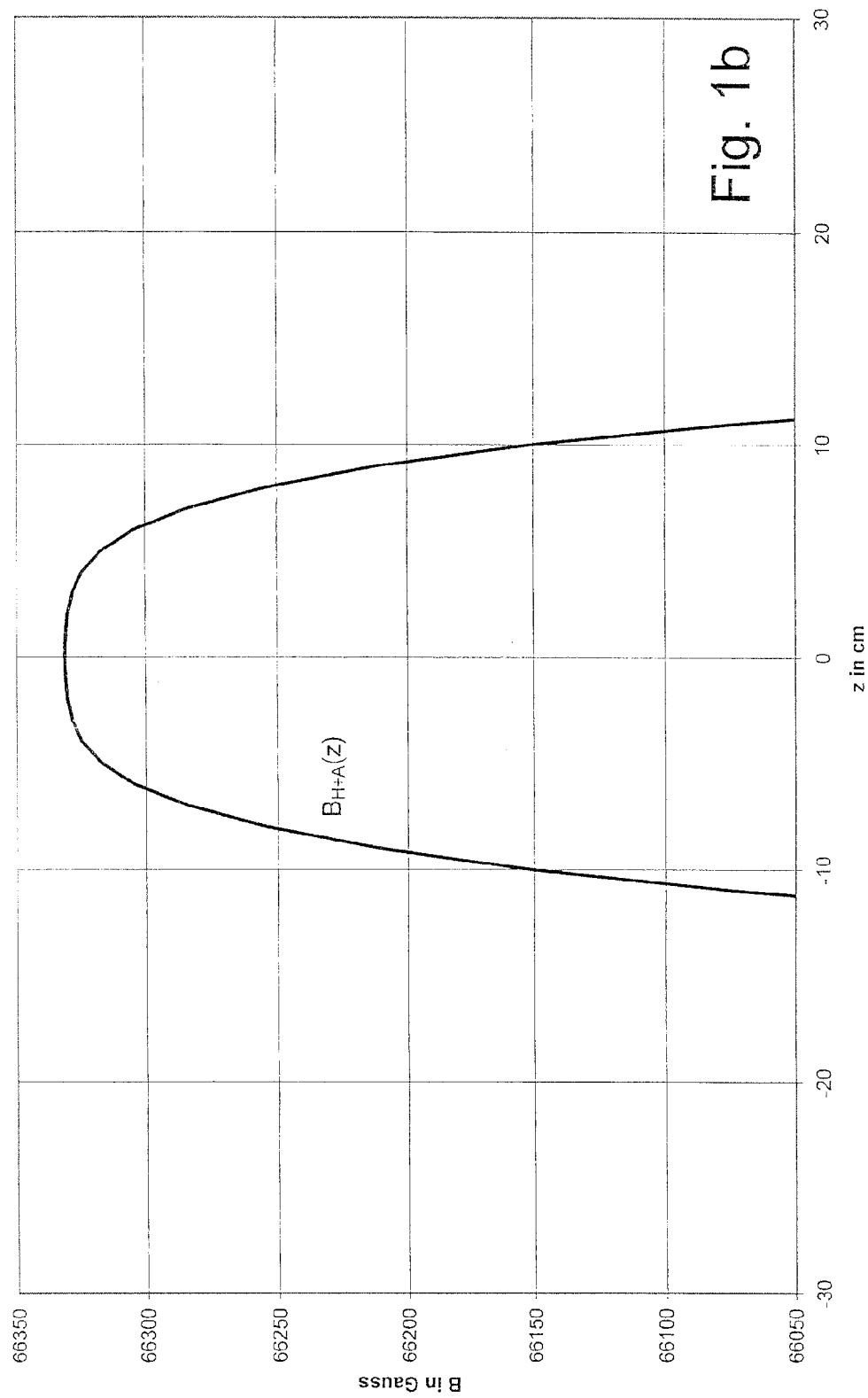

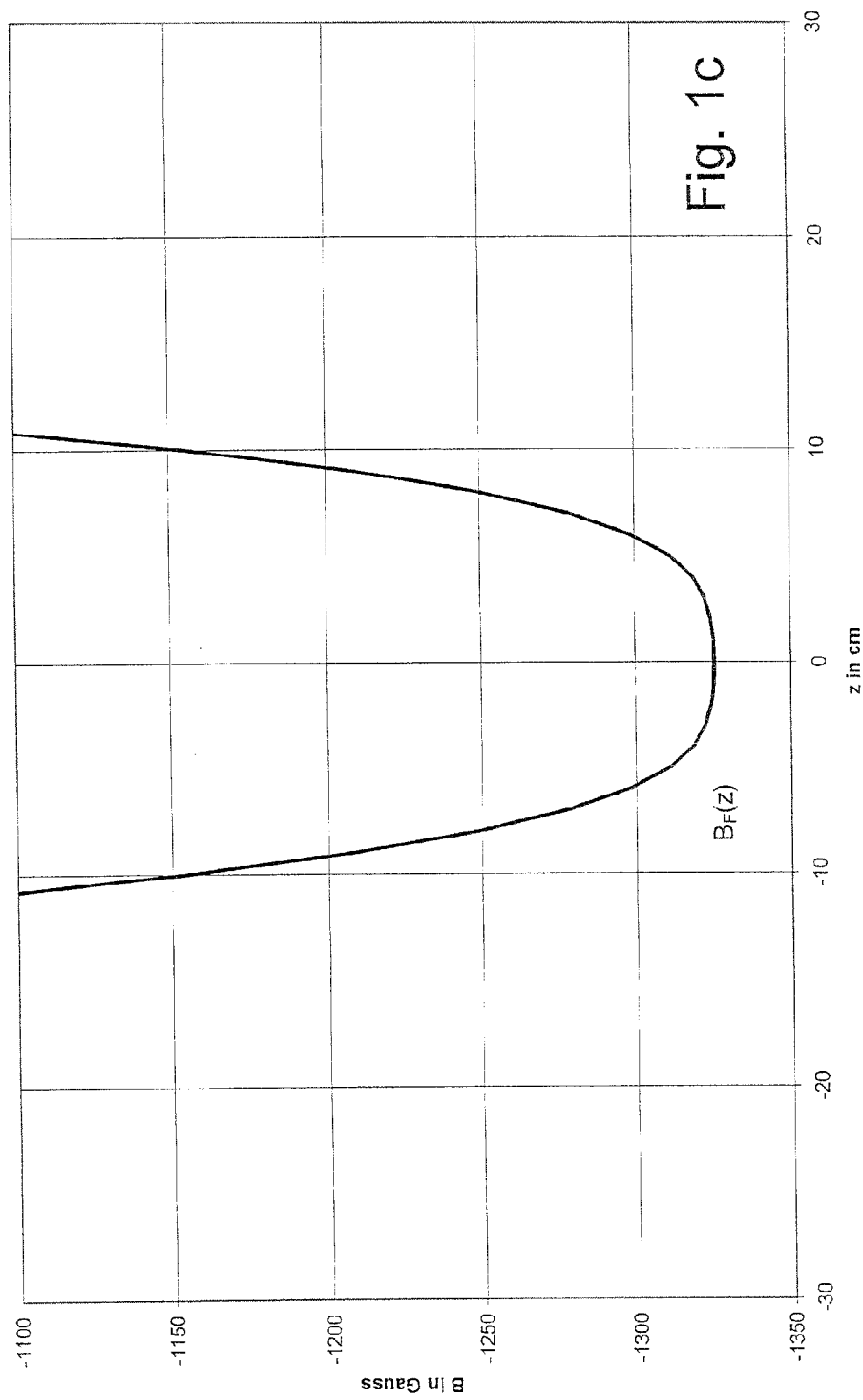

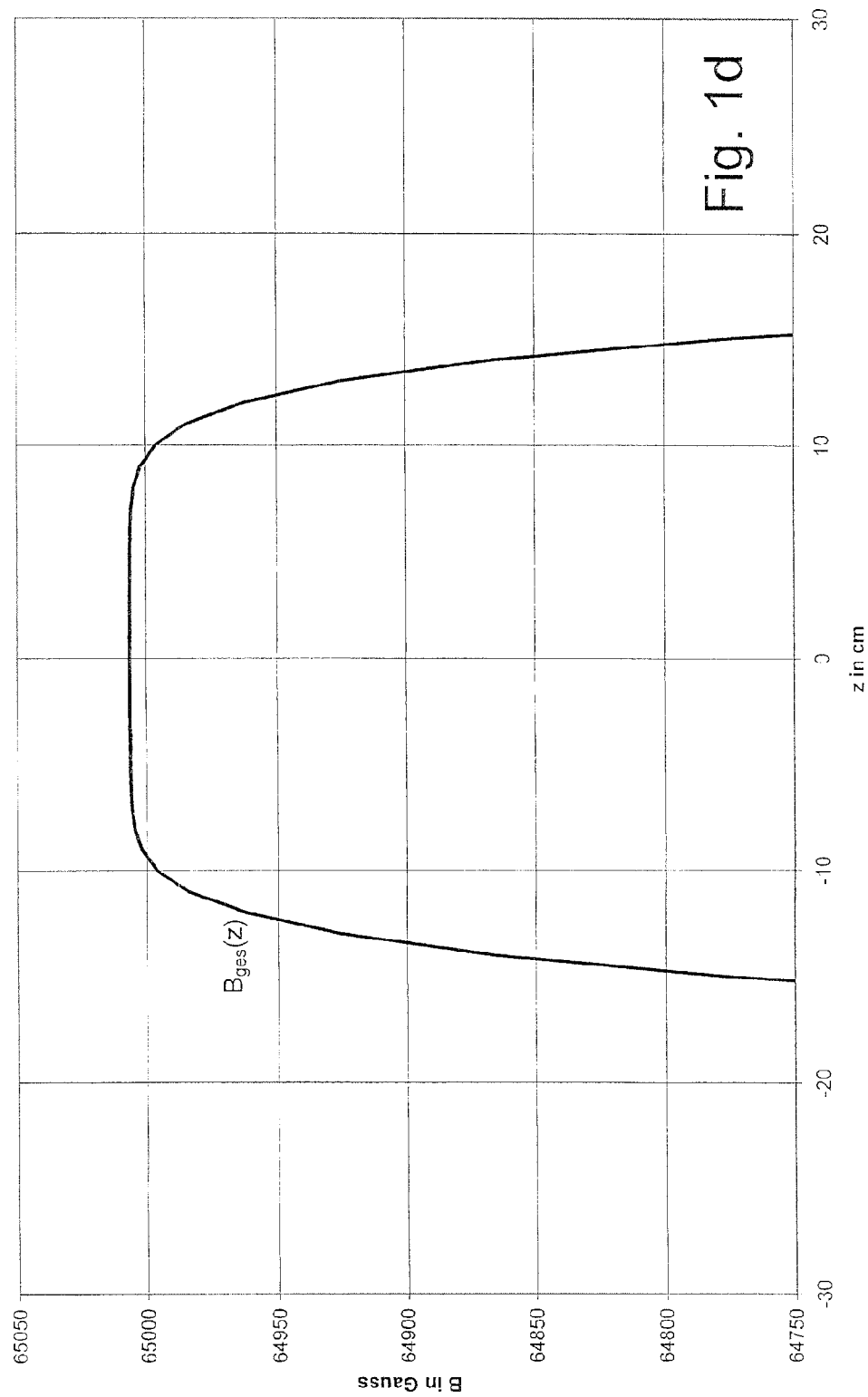

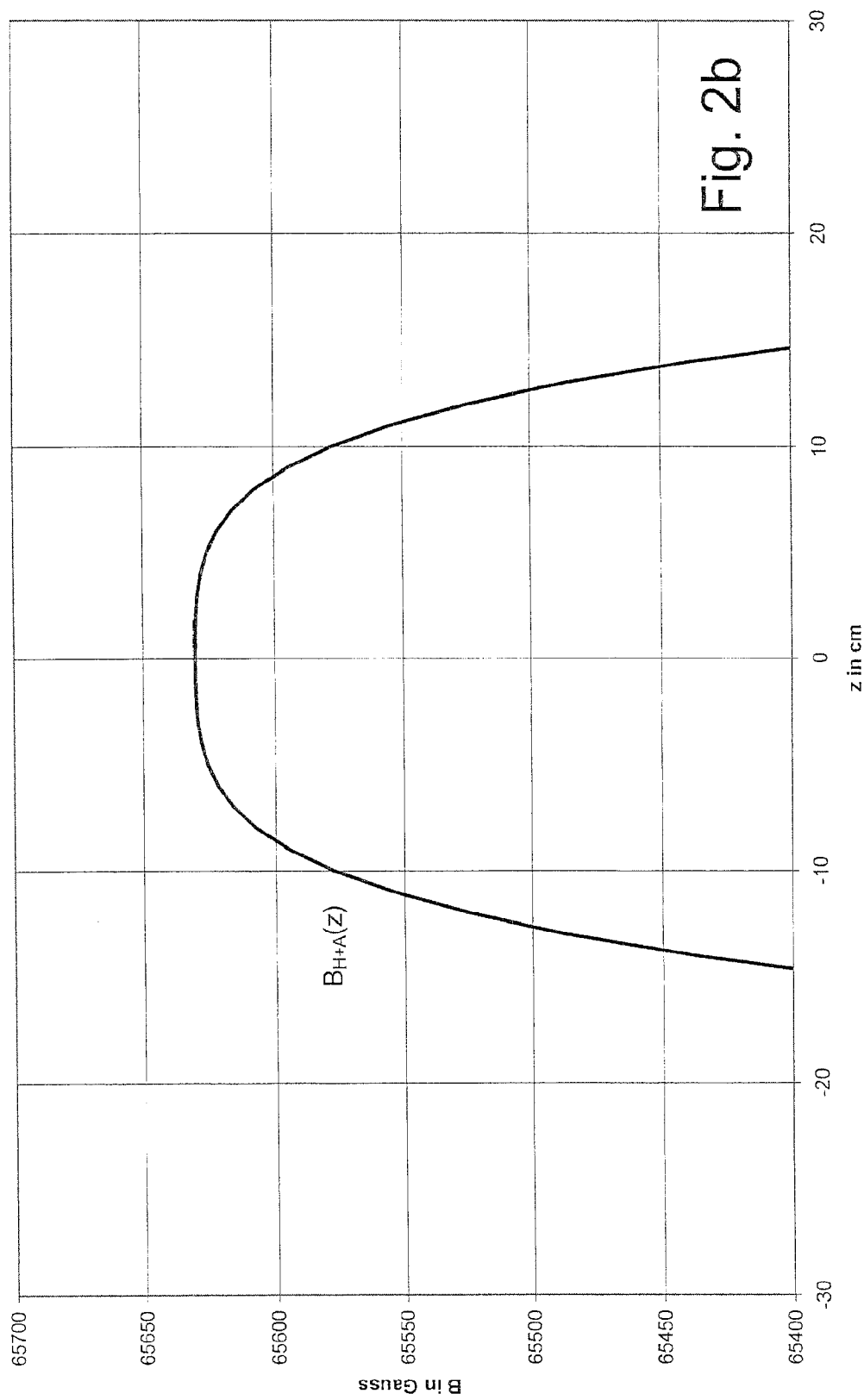

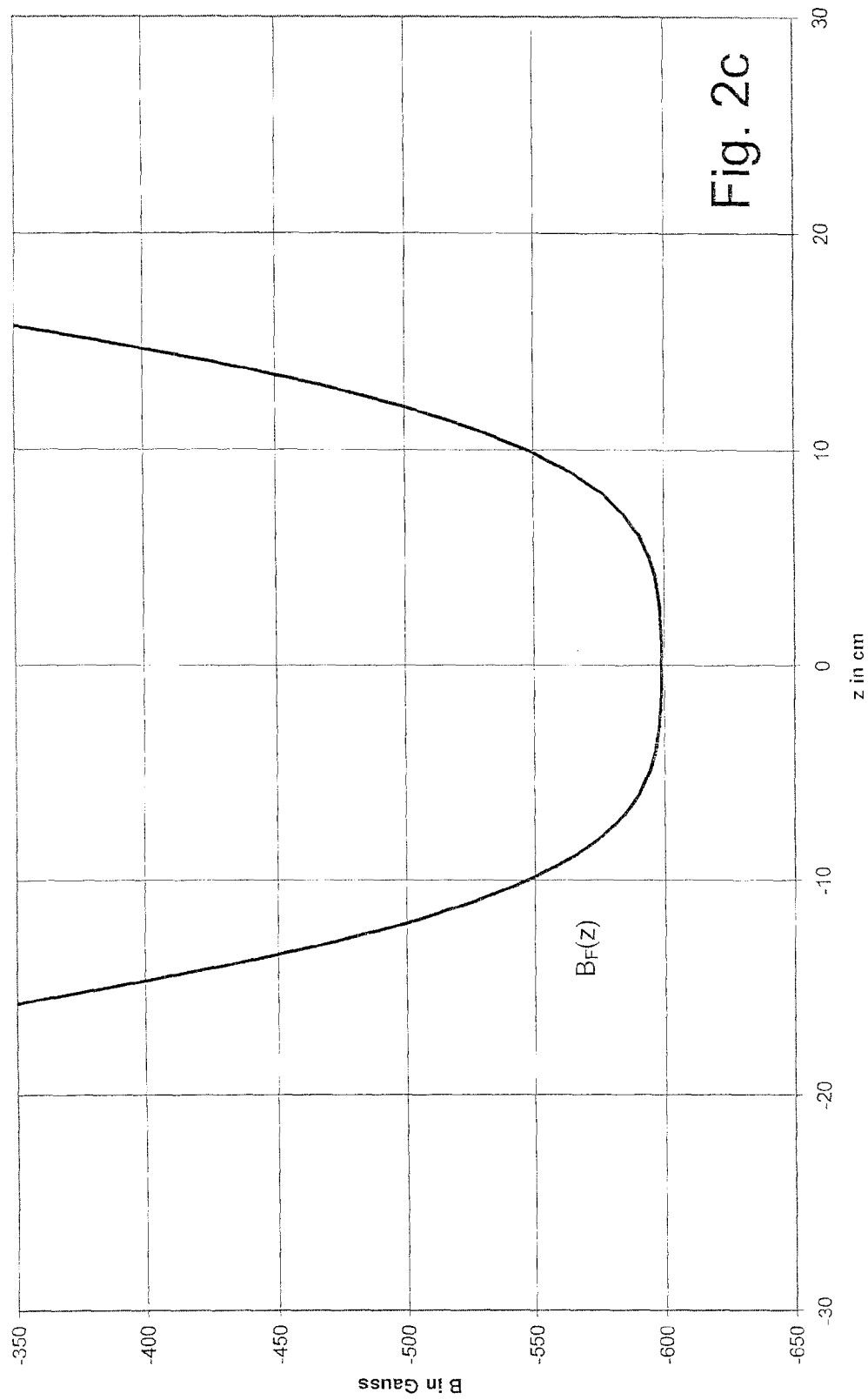

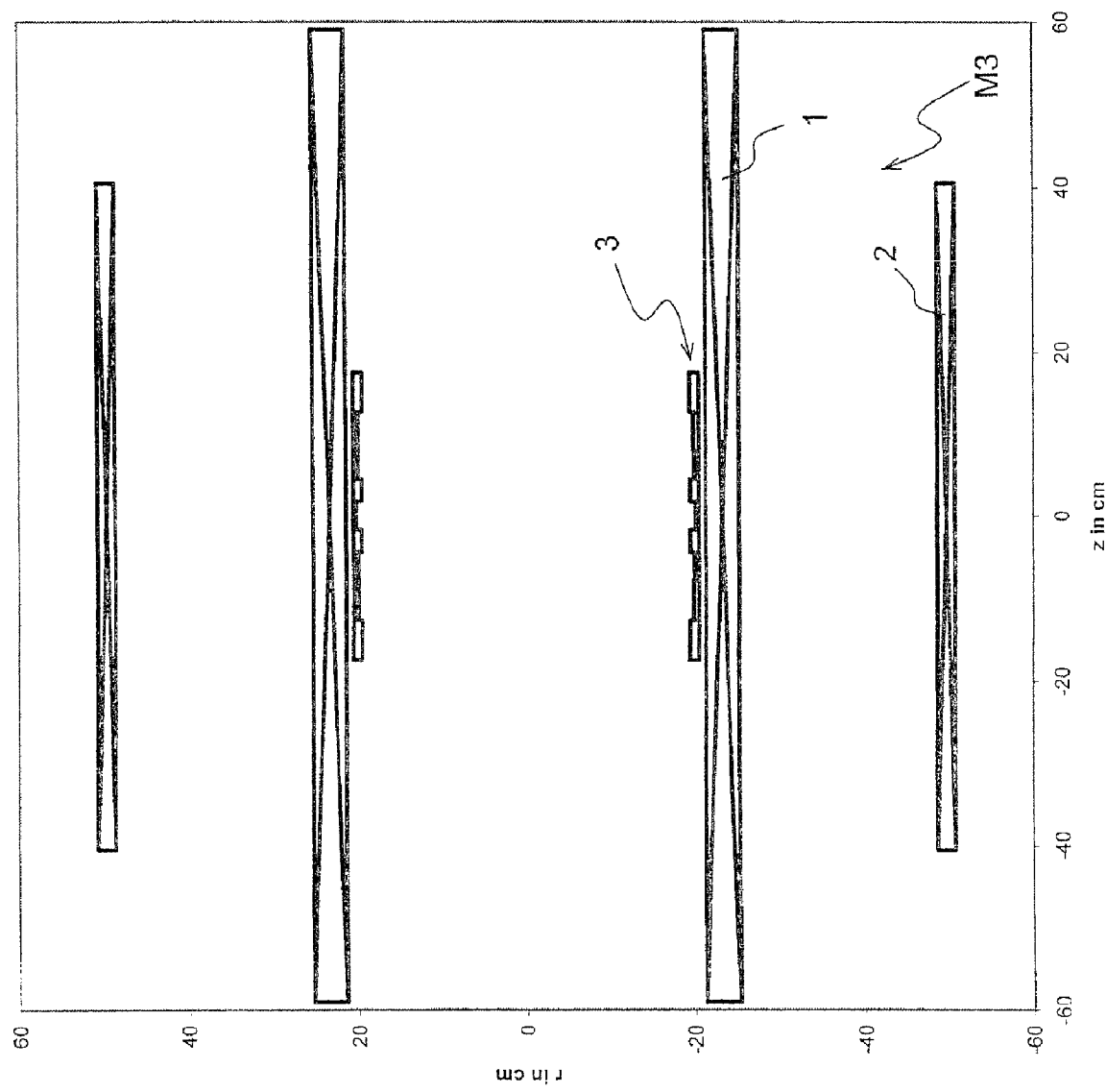

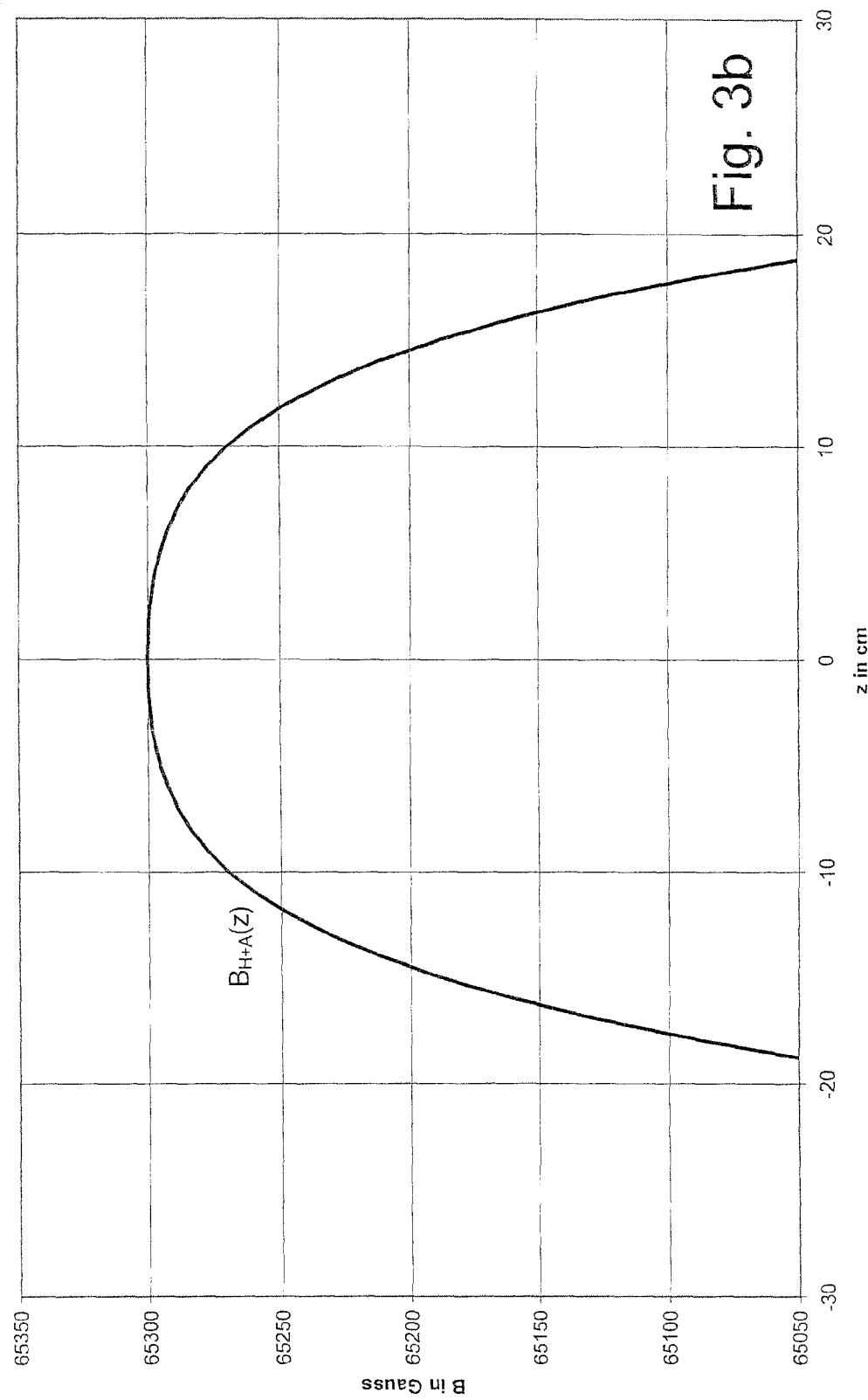

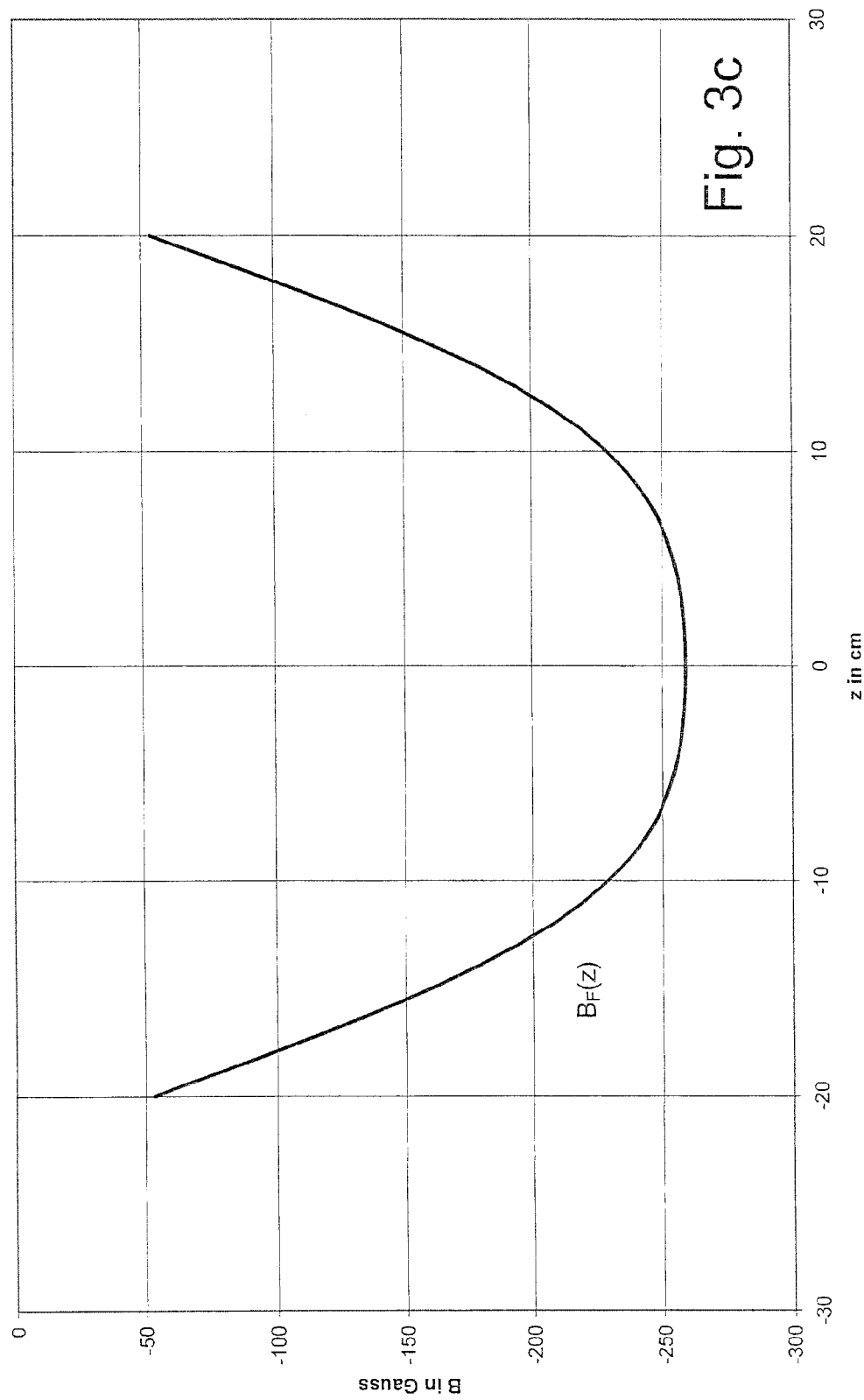

COMPACT SUPERCONDUCTING MAGNET CONFIGURATION WITH ACTIVE SHIELDING, WHEREIN THE SHIELDING COIL DAMPS THE FIELD MAXIMUM OF THE MAIN COIL AS WELL AS ASSOCIATED MAGNETIC RESONANCE TOMOGRAPH, NMR SPECTROMETER AND ION CYCLOTRON RESONANCE MASS SPECTROMETER

This application claims Paris Convention priority of DE 10 2009 045 373.3 filed Oct. 6, 2009 the complete disclosure of which is hereby incorporated by reference.

BACKGROUND OF THE INVENTION

The invention concerns an actively shielded superconducting magnet configuration for generating a homogeneous magnetic field $B_0$ in a volume under investigation,
with a radially inner superconducting main field coil which is disposed rotationally symmetrically about a z-axis,
and with a coaxial radially outer superconducting shielding coil which is driven in the opposite direction,
wherein the magnet configuration consists of the main field coil, the shielding coil and a ferromagnetic field-shaping device,
wherein the ferromagnetic field-shaping device is disposed radially inside the main field coil,
the main field coil consists of an unstructured solenoid coil or of several radially nested unstructured solenoid coils which are operated in the same direction, and
the extension $L_{abs}$ of the shielding coil in the axial direction is smaller than the extension $L_{haupt}$ of the main field coil in the axial direction.

A magnet configuration of this type is disclosed in DE 2008 020 107 A1, published after the priority date of the instant invention.

Nuclear magnetic resonance (NMR) is a method of investigating the properties of a sample. NMR spectroscopy is used to analyze the chemical composition (or the chemical bonds) of a sample. NMR tomography is generally used to determine the proton density (or the water content) as a function of the location in a relatively large sample (e.g. part of a human body) in order to obtain information about the internal structure of the sample. In both cases, the basic principle of NMR consists in irradiating RF (radio frequency) pulses into a sample located in a static magnetic field and measuring the RF reaction of the sample. The RF reaction gives information about the properties of the sample. Particularly strong homogeneous static magnetic fields are generally preferred for NMR, since they produce the measuring results with the best quality.

Superconducting magnet coils can generate high magnetic field strengths, wherein the superconducting magnet coils are generally cooled with liquid helium in a cryostat to a typical operating temperature of 4.2 K. Solenoid-shaped magnet coils which surround a circular cylindrical or spherical or ellipsoidal volume under investigation are thereby particularly often used.

In order to homogenize the static magnetic field in the volume under investigation ("shimming"), ferromagnetic material is conventionally disposed in the vicinity of the volume under investigation, in particular, inside the main field coil ("passive shim") cf. e.g. U.S. Pat. No. 6,897,750, and also additional magnetic field coils (shim coils) are conventionally provided, the magnetic field of which is superimposed on the magnetic field of a main field coil ("active shim"). U.S. Pat. No. 6,265,960 also discloses superconducting shim coil systems in the cryostat. Both the active and the passive shim systems are based on the fact that the main field coil and the shim system together produce a homogeneous magnetic field in the volume under investigation.

Unless particular measures are taken, a strong magnetic field in the volume under investigation is accompanied by a noticeable ambient magnetic field. This ambient magnetic field is also called stray field and is basically not desired, since it can destroy technical devices in the surroundings. Stray fields can e.g. delete magnetic memories of hard discs or credit cards or cause failure of pacemakers. Stray fields are reduced, in particular, by providing a shielding coil radially outside of the main field coil, which generates a magnetic dipole moment which is substantially of the same magnitude but of opposite direction compared to the main field coil.

The main field coil e.g. according to prior art cited in EP 1 564 561 A1, FIG. 1, comprises several windings of superconducting wire, which are disposed axially next to one another, and thereby represents a structured solenoid coil. The use of a structured solenoid coil as main field coil is advantageous, since the spatial dependence of the magnetic field in the volume under investigation can be designed relatively easily through the type of structure such that in total, i.e. together with the magnetic field, which is generated by the shielding coil, one obtains a homogeneous magnetic field in the volume under investigation. The influence of the shielding coil on the homogeneity of the magnetic field in the volume under investigation is thereby generally relatively small due to the larger radial separation from the volume under investigation compared to the main field coil. The windings of this structured solenoid coil are basically held by a mechanical holding device and are generally located in the winding chambers of a coil body. Due to the magnetic field generated by the windings, the windings strongly attract each other, wherein they are forced in an axial direction against the holding device, in general, the lateral limiting surfaces of the winding chambers. In particular, in magnet configurations for generating particularly strong magnetic fields of e.g. 6 T and more, the associated surface pressure can reach very high values.

One essential disadvantage of such magnet configurations with structured main field coils consists in that these very high surface pressures can cause mechanical relaxation processes in the bordering windings of superconducting wire, wherein these become normally conducting and trigger a so-called quench due to their negligibly small thermal capacitance at the low operating temperature. This result is undesirable and expensive, since the magnet coil heats up from the operating temperature to values in the region of 40 to 80 K during a quench, the expensive liquid helium, which is used for cooling, evaporates and is lost, and restarting of the magnet configuration may be associated with time delays of several days.

U.S. Pat. No. 6,617,853 discloses a magnet configuration with a main field coil with structured and unstructured solenoid coils. According to this document, it is possible to simplify magnet configurations by disposing a field-shaping device of magnetic material radially inside the main field coil. However, the main field coils according to U.S. Pat. No. 6,617,853 comprise at least partially structured solenoid coils to ensure generation of sufficiently homogeneous magnetic fields. In accordance with U.S. Pat. No. 6,617,853, simplified main field coils with field-shaping devices of magnetic material can be realized only when the field-shaping device at least partially has a shorter radial separation of less than 80 mm from the magnet axis and therefore a sufficiently high efficiency. Magnet configurations with a larger useful diameter of e.g. 30 cm and more cannot be realized with this restriction.

Actively shielded magnet configurations in accordance with US 2006/0061361 manage completely without any sections with structured solenoid coils as main field coil. These configurations also comprise field-shaping devices of magnetic material radially inside the main field coil, however, without the restriction of the small radial separation of the field-shaping device from the magnet axis. The structure of the main field coil completely without structured solenoid coils becomes possible by using a suitably dimensioned magnet body of magnetic material radially outside of the main field coil. However, for magnet configurations with a useful diameter of e.g. 60 cm and more, the magnetic body and therefore the entire magnet configuration would become very heavy, which would increase the transport cost and limit the possibilities of installing the magnet configuration due to the large floor loading.

EP 0 332 176 A2 discloses magnet configurations which comprise a main field coil, a shielding coil, a field-shaping device of magnetic material, which is disposed radially inside the main field coil, and a yoke magnetic shielding of magnetic material, which is disposed radially outside the shielding coil, wherein the axial extension of the shielding coil is larger at that location than the axial lengths of the main field coil and the yoke magnetic shielding. This prior art document proposes designing the main field coil as a structured solenoid coil. In accordance with the teaching of EP 0 332 176 A2, a magnet configuration with a sufficiently homogeneous magnetic field $B_0$ in the volume under investigation cannot be realized with an unstructured solenoid coil as main field coil, but only with a structured solenoid coil as the main field coil.

DE 10 2008 020 107 A1 (published after the priority date of the instant invention) discloses an actively shielded magnet configuration consisting of a radially inner main field coil, a radially outer shielding coil as well as a ferromagnetic field forming device disposed within the main field coil. The main field coil consists of an unstructured solenoid coil or of a plurality of radially nested unstructured solenoid coils driven in the same direction, wherein the shielding coil is axially shorter than the main filed coil. The magnetic filed produced along the z-axis by the main filed coil and the shielding coil has a field strength minimum at the center and maxima at each side of the center. The ferromagnetic field forming device produces a field shape having a maximum in field strength in the center as well as minima in field strength at each side of the center.

It is therefore the underlying purpose of the invention to provide an actively shielded superconducting magnet configuration with a homogeneous and particularly high magnetic field $B_0$ in the volume under investigation, the structure of which is considerably simplified, in particular, wherein the main field coil can exclusively be constructed from unstructured solenoid coils and the overall magnet configuration can be designed to be much more compact.

SUMMARY OF THE INVENTION

This object is achieved by a magnet configuration of the above-mentioned type, which is characterized in that, along the z-axis in the center at z=0, $$\left.\frac{d^2}{dz^2}B_{H+A}(z)\right|_{z=0} \leq 0$$

applies for the axial magnetic field profile $B_{H+A}(z)$ generated by the main field coil and the shielding coil during operation, and $$\left.\frac{d^2}{dz^2}B_F(z)\right|_{z=0} \geq 0$$

applies for the axial magnetic field profile $B_F(z)$ generated by the ferromagnetic field-shaping device during operation and along the z-axis in the center at z=0,
wherein the z-axis is oriented in the positive direction of the $B_0$-field.

The superposition of the magnetic field profile of the main field coil along the axis (z-axis) of the main field coil $B_H(z)$, which has a pronounced ("sharp") maximum in the center at z=0, with the axial magnetic field profile of the shielding coil $B_A(z)$, which has a minimum in the center, produces a flat superposed magnetic field profile $B_{H+A}(z)$ of main field coil and shielding coil when the length $L_{abs}$ of the shielding coil is smaller than the length $L_{haupt}$ of the main coil. The magnetic field profile $B_{H+A}(z)$ of the main field coil and the shielding coil then has a less pronounced ("broader") maximum in the center, or the center is in an extended z-area of constant (positive) magnetic field strength, from which the magnetic field drops on both sides. The curvature in the center is correspondingly zero or negative.

The magnetic field profile $B_F(z)$ of the field-shaping device, in turn, has a minimum in the center, or the center is in an extended z-area of constant (negative) magnetic field strength, from which the magnetic field rises on both sides. The curvature in the center is correspondingly zero or positive. Under these conditions, superposition can generate an area of a homogeneous overall field strength $B_0$ which extends, in particular, in the axial direction.

The inventive magnet configuration is generally designed such that the magnet configuration alone, without production tolerances, would already generate a homogeneous (in particular, for NMR applications and preferably also for high-resolution NMR applications a sufficiently homogeneous) $B_0$-field in the volume under investigation ("theoretically homogeneous design"). Inhomogeneities caused by production tolerances typically fluctuate in a range of up to 200 ppm with respect to the field $B_0$ in the center. The inhomogeneities due to production tolerances can be easily compensated for by the usual shimming measures (e.g. adjustable/flexible ferromagnetic field-shaping devices or shim coils with an electrical circuit which is separate from the main field coil, usually operated with considerably smaller current densities than the main field coil).

The relationship between $L_{abs}$ and $L_{haupt}$ is typically defined by $0.6 \leq L_{abs}/L_{haupt} \leq 0.9$. When there are several unstructured solenoid coils of the main field coil, they are connected in series.

According to prior art, the magnetic field $B_0$ in the volume under investigation is homogenized in that the main field coil generates a magnetic field with a first intensity profile in an axial direction, and the (active or passive) shim system generates a magnetic field with a second complementary intensity profile in an axial direction. Superposition of the two profiles obtains a magnetic field strength in the volume under investigation, which is constant over a large axial length. The conventional shielding coil is thereby sufficiently far away from the volume under investigation that the magnetic field produced by it has no noticeable influence on the field homogeneity in the volume under investigation.

In contrast thereto, the invention integrates the shielding coil in the homogenization of the static magnetic field in the volume under investigation. In the inventive magnet configuration, the main field coil and the shielding coil generate a combined magnetic field with a broad flat intensity profile in the axial direction (z direction). The length of the shielding coil therefore becomes sufficiently short and furthermore, the radial separation of the shielding coil from the main field coil is selected to be sufficiently small. The ferromagnetic field-shaping device acts as passive shim system and generates, during operation, a magnetic field contribution with an intensity profile which is complementary to the overall intensity profile of main coil and shielding coil. The superposition of the intensity profile of the ferromagnetic field-shaping device with the intensity profile of the overall main field coil and shielding coil produces a magnetic field intensity in the volume under investigation, which is constant over a large axial length. The inventive magnet configuration typically obtains field homogeneities of $10^{-5}$ or better, preferably $10^{-6}$ or better in the volume under investigation.

In the inventive design, the shielding coil can and must be radially moved closer to the volume under investigation in order to effectively act on the intensity profile of the magnetic field in the volume under investigation. The magnet configuration therefore becomes more compact in the radial direction. Within the scope of the invention, $R_{iabs} \leq 2.2*R_{ihaupt}$, and preferably $R_{iabs} \leq 1.8*R_{ihaupt}$ typically applies for the inner radius of the shielding coil $R_{iabs}$ and the inner radius of the main field coil.

The axial extension $L_{abs}$ of the shielding coil in the inventive design can and must be smaller than the axial extension $L_{haupt}$ of the main field coil, since only in this way can the field profile generated by the main field coil be flattened. The shielding coil has an opposite polarity (or a current flow in an opposite direction) compared to the main field coil, but is generally connected in series with the main field coil. The broad positively curved intensity profile of the overall main field coil and shielding coil results from a weakening of the intensity profile of the main field coil in the axial central area, which has a local maximum or a local high plateau, by the superposed intensity profile of the shielding coil, which has a local minimum or a local low plateau. The shielding coil, which is reduced in length in the axial direction compared to the main field coil, creates space for supply towers of the cryostat. These may be drawn axially further inwardly in the radially outer area compared to prior art.

The compact structure of the inventive magnet configuration saves space, in particular with respect to the height of the magnet configuration including cryostat, and also material and weight. The inventive magnet configuration consists (in as far as the generation of the static magnetic field $B_0$ is concerned) only of the main field coil, the shielding coil and the ferromagnetic field-shaping device. In particular, there are no further field-shaping coils which are connected in series with the main field coil.

The simplified structure which is substantially only based on unstructured solenoid coils which can be easily and exactly produced, also improves the production tolerance in the manufacture of the inventive magnet configuration. Since the coils need not be structured and only a few coils are required altogether, the quench safety is also increased: The number of axial coil edges, which are more likely to quench due to large forces, is minimized in the inventive magnet configuration.

A homogeneous magnetic field $B_0$ can be generated in the volume under investigation only by the components of an inventive magnet configuration, i.e. only by the main field coil, the shielding coil and the ferromagnetic field-shaping device. A magnetic field with minor inhomogeneities (e.g. less than 200 ppm) in the volume under investigation, which are caused e.g. by production tolerances of the magnet configuration and which can be eliminated by conventional shimming measures, is also regarded as homogeneous within the scope of the invention. These minor inhomogeneities can be compensated for within the scope of the invention e.g. by adjusting or setting metal plates on the ferromagnetic field-shaping device or by additional shim coils, which are operated separately from the main field coil. The invention, however, does not use any field-shaping magnet coils which are integrated in the electrical circuit of the main field coil other than the main and shielding coils.

In one preferred embodiment of the inventive magnet configuration, the curvature $$\frac{d^2}{dz^2} B_{H+A}(z)$$

in the center at z=0 is substantially identical but of opposite direction to the curvature $$\frac{d^2}{dz^2} B_F(z).$$

Identical but of opposite direction in this connection means having the same magnitude but opposite signs. This adjustment of the curvature radii leads to a very well homogenized overall field of main field coil, shielding coil and field-shaping device in the area close to the center. In one particularly preferred embodiment, the curvature $$\frac{d^2}{dz^2} B_{H+A}(z)$$

about the center at z=0 in a z range between −a to a, is substantially identical but of opposite direction to the curvature $$\frac{d^2}{dz^2} B_F(z),$$

with 2a: diameter of the measuring volume in the z direction. The curvature dependence which is equal but of opposite direction over the sample volume leads to a magnetic field which is very well homogenized over the entire sample volume.

In another preferred embodiment, the following applies for the extension $L_{haupt}$ of the main field coil in the axial direction and the inner radius $R_{ihaupt}$ of the main field coil: $L_{haupt} \geq 3.5*R_{ihaupt}$, and preferably $L_{haupt} \geq 4.5*R_{ihaupt}$, and preferentially $L_{haupt} \geq 5.5*R_{ihaupt}$. With these dimensional proportions it is possible to obtain a very homogeneous field dependence in an area having a particular extension in the z direction. The field of the shielding coil can, in particular, very efficiently smooth the field dependence of the main field coil.

In another preferred embodiment, the shielding coil consists of an unstructured solenoid coil. This simplifies the structure of the inventive magnet configuration. The main field coil preferably also consists of only one unstructured solenoid coil. The overall magnet configuration with the three functions generation of strong magnetic fields,
large volume under investigation with large field homogeneity; and
small extension of the stray field then merely consists of two unstructured solenoid coils and the ferromagnetic field-shaping device. There is no simpler feasible magnet configuration having merely two unstructured solenoid coils as the only superconducting components. In an alternative variant which also represents a relatively simple structure, the shielding coil may be constructed from several radially nested unstructured solenoid coils which are operated in the same direction. In another alternative variant of these particularly simple embodiments in accordance with the invention, structured solenoid coils may be provided as shielding coils. The shielding coil of an inventive magnet configuration may e.g. consist of two unstructured solenoid coils which are mirror-symmetrically disposed with respect to the center of the volume under investigation, wherein the following applies for the axial separation $L_{sep}$ of these solenoid coils: $L_{sep} < 0.15 * L_{abs}$. It should be noted that these two unstructured solenoid coils may also be regarded as two separate windings of a structured solenoid coil. In this example, the shielding coil is divided into two parts. This prevents an excessive drop of the static magnetic field in the center of the volume under investigation, in particular, when the shielding coils are very short in the axial direction.

In another preferred embodiment, the main field coil only consists of an unstructured solenoid coil. This also simplifies the structure of the inventive magnet configuration. Moreover, this configuration is particularly advantageous in view of the effect of the magnetic Lorentz forces in the main field coil. These basically pull the radially inner windings of the main field coil in a radial outward direction and press the radially outer windings in a radially inward direction. When all windings of the main field coil have been combined in one single solenoid coil, the radially further inward windings are supported on the radially further outward windings such that the above-mentioned forces partially or completely cancel. One general advantage of the inventive magnet configuration consists in that the overall main field coil can be combined into one single unstructured solenoid coil. The combination of the main field coil into an unstructured solenoid coil is, however, generally not possible when the main field coil comprises superconducting wires of different materials e.g. $Nb_3Sn$ and $NbTi$. The use of two different materials may be required for generating particularly large magnetic field strengths which are above the critical magnetic field strength of the material NbTi (e.g. 10 T at an operating temperature of 4.2 K). In this case and within the scope of the invention, a main field coil comprising several unstructured solenoid coils may be used.

In a preferred embodiment of the inventive magnet configuration, the axial magnetic field profile $B_{H+A}(z)$ generated by the main field coil and the shielding coil during operation monotonically drops on both sides of the center along the z-axis. This field dependence can be easily adjusted when the shielding coil consists of an unstructured solenoid coil. Moreover, homogenization via the field-shaping device is particularly simple.

In one advantageous embodiment, the axial magnetic field profile $B_{H+A}(z)$ generated by the main field coil and the shielding coil during operation along the z-axis within the volume under investigation varies by maximally 500 ppm, preferably maximally 100 ppm. In particular, for elongated magnet configuration structures, adjustment of such a flat field dependence is facilitated and only a small amount of iron is required inside the main field coil for field shaping.

In another preferred embodiment, the main field coil and the shielding coil are electrically connected in series. The same current then flows through the main field coil and the shielding coil. This facilitates adjustment and simplifies charging of the magnet configuration.

In an advantageous further development of this magnet configuration, a superconducting switch is provided for short-circuiting the electrical circuit formed by the main field coil and the shielding coil. The magnet configuration can thereby be operated in the "persistent mode" (continuous operation without voltage source).

In accordance with another advantageous embodiment, the magnet configuration is designed for generating the homogeneous magnetic field in the volume under investigation with a field strength of $B_{ges} \geq 6$ Tesla, preferably $B_{ges} \geq 9$ Tesla. With field strengths of this magnitude and the required correspondingly large magnet coils, the advantages of the invention with respect to the compact structure will be fully apparent.

In another preferred embodiment, the following applies for the inner radius $R_{if}$ of the field-shaping device:

$R_{if} \geq 80$ mm, and preferentially $R_{if} \geq 300$ mm. These dimensions of the inner radius of the field-shaping device, in turn, emphasize the advantages of the invention with respect to the compact structure. It should be noted that the volume under investigation typically extends in an area of an axial length of at least 30% of $R_{if}$, and in an area of a radial length of at least 30% of $R_{if}$.

In another preferred embodiment, $$\frac{d^2}{dz^2}B_H(z) < 2\frac{d^2}{dz^2}B_{H+A} \leq 0$$

applies for the magnetic field profile $B_H(z)$ generated by the main field coil alone and for the axial magnetic field profile $B_{H+A}(z)$ generated by the main field coil and the shielding coil during operation along the z-axis, in the center at z=0. In this case, the contribution of the shielding coil to homogenizing the magnetic field profile in the volume under investigation is relatively strong such that the design of the ferromagnetic field-shaping device is simpler and smaller.

In another preferred embodiment of the inventive magnet configuration, the magnet configuration consists of the main field coil, the shielding coil, the ferromagnetic field-shaping device and a ferromagnetic shielding body, wherein the ferromagnetic shielding body radially and axially surrounds the main field coil and the shielding coil. In this case, the magnet configuration has a somewhat more complex structure than described in claim 1, since it additionally comprises the outer shielding body. The shielding body reduces the stray field of the magnet configuration. The shielding body also slightly influences the magnetic field dependence in the volume under investigation. The magnetic field profile $B_{F+AK}(z)$ generated by the field-shaping device and the shielding body together replaces the magnetic field profile $B_F(z)$ generated by the field-shaping device, in particular, $$\left.\frac{d^2}{dz^2}B_{F+AK}(z)\right|_{z=0} \geq 0$$

applies for the axial magnetic field profile $B_{F+AK}(z)$ generated by the ferromagnetic field-shaping device and the shielding body during operation along the z-axis in the center at z=0.

The shielding body may be designed, in particular, as the outer wall of a cryostat, in which at least the main field coil and the shielding coil are arranged. The proportion $B_{AK}(z)$ of the shielding body with respect to the common field profile ($B_{F+AK}(z)$) is typically less than 10% at any location in the volume under investigation. The shielding body is typically produced from magnetically soft material such as steel. The shielding body also preferably surrounds the field-shaping device both in an axial and radial direction.

In an advantageous embodiment, the field-shaping device is disposed inside a cryostat together with the main field coil and the shielding coil. In this case, the ferromagnetic material of the field-shaping device is also cooled.

In an alternative variant, the field-shaping device is disposed in a room temperature bore of a cryostat, wherein the main field coil and the shielding coil (2) are disposed in the cryostat. In this case, the field-shaping device, which is at room temperature and is easy to access, can be easily readjusted if required, e.g. by displacing or supplementing small iron plates.

The field-shaping device may also be partially disposed in a room temperature bore of a cryostat and partially inside the cryostat, wherein the main field coil and the shielding coil are also disposed in the cryostat. This enables cooling of part of the ferromagnetic field-shaping device, and another part remains easily accessible and at room temperature, in particular, for adjustment purposes.

In a particularly preferred embodiment, the field-shaping device is additionally designed for compensating for field inhomogeneities which are caused by production tolerances of the main field coil and/or the shielding coil and/or the ferromagnetic shielding body. Towards this end, the common field profile of the main field coil and the shielding coil is measured after production and mounting thereof, and only then is the field-shaping device generated and mounted by taking into consideration the measuring results. This improves the field homogeneity in the volume under investigation. Alternatively or additionally, an electrical shimming system (in particular normally conducting and with an electrical circuit which is independent of the main field coil) is also feasible which is used for compensating for field inhomogeneities which are caused by production tolerances of the magnet configuration. The contribution of electric shim systems is typically 200 ppm or less at any location in the volume under investigation, relative to $B_0$ in the center.

The invention also concerns a magnetic resonance tomograph with an inventive magnet configuration. An inventive NMR tomograph has a particularly compact structure.

The invention also concerns a nuclear magnetic resonance spectrometer with an inventive magnet configuration. An inventive NMR spectrometer is also particularly compact.

The invention finally also concerns an ion cyclotron resonance mass spectrometer with an inventive magnet configuration. The inventive ICR spectrometer is also particularly compact.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

The invention is shown in the drawing and explained in more detail with reference to embodiments.

BRIEF DESCRIPTION OF THE DRAWING

FIG. 1b shows the dependence of the axial magnetic field profile which is generated by the main field coil and the shielding coil of the magnet configuration according to FIG. 1a;

FIG. 1c shows the dependence of the axial magnetic field profile generated by the ferromagnetic field-shaping device of the magnet configuration according to FIG. 1a;

FIG. 1d shows the dependence of the axial magnetic field profile generated by the main field coil and the shielding coil and the ferromagnetic field-shaping device of the magnet configuration according to FIG. 1a;

FIGS. 2a-2d show views of the cross-section and the dependence of the field profiles in correspondence with FIGS. 1a to 1d of a second embodiment of an inventive magnet configuration;

FIGS. 3a-3d show views of the cross-section and the dependence of the field profiles in correspondence with FIGS. 1a to 1d of a third embodiment of an inventive magnet configuration;

FIG. 5 shows the dependence of the axial magnetic field profile generated by the main field coil of the magnet configuration according to FIG. 1a;

FIG. 6 shows the dependence of the axial magnetic field profile generated by the shielding coil of the magnet configuration according to FIG. 1a;

DESCRIPTION OF THE PREFERRED EMBODIMENT

Figure 1A:
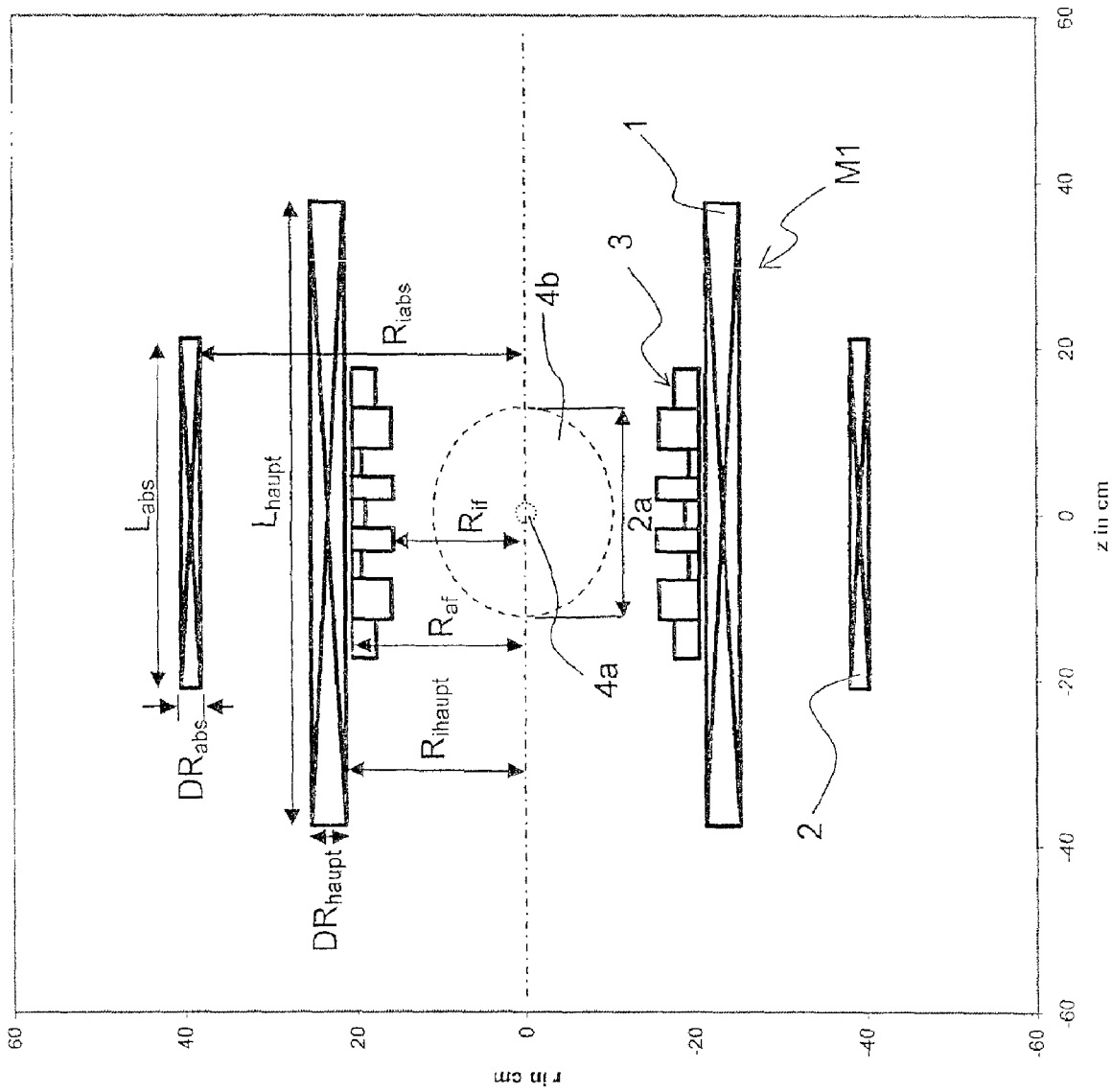
FIG. 1a shows a schematic view, taken to scale, of the cross-section of a first embodiment of an inventive magnet configuration, with an unstructured solenoid coil as main field coil and an unstructured solenoid coil as shielding coil, and a ferromagnetic field-shaping device.

By way of example, FIG. 1a shows a schematic cross-sectional view, taken to scale, of a first embodiment of an inventive magnet configuration. The embodiments of the figure groups 2 and 3 are of similar structure.

The magnet configuration M1 consists of a main field coil 1, a shielding coil 2 and a ferromagnetic field-shaping device 3. Further means for generating a magnetic field are not provided. The magnet configuration M1 is substantially rotationally symmetrical with respect to the axis which extends in the z direction and is illustrated with dash-dotted lines.

In a volume under investigation 4b, the magnet configuration M1 generates a homogeneous magnetic field $B_0$ around its center 4a (at z=0, r=0), which is oriented in the z direction and has a strength of 6.5 T in the center 4a. The volume under investigation 4b has a diameter of 2a in the z direction (wherein the limitation of the volume under investigation is not shown to scale).

The main field coil 1 is an unstructured solenoid coil and the shielding coil 2 is also an unstructured solenoid coil. The main field coil 1 and the shielding coil 2 are electrically connected in series, wherein the currents in the two coils flow in opposite directions such that the magnetic dipole moments of the two coils cancel in order to minimize the stray field. The magnet configuration M1 moreover comprises the ferromagnetic field-shaping device 3 which, in this case, consists of nine iron rings or an iron alloy ("iron rings"). All iron rings thereby have the same outer radius of 0.2054 m. The inner radii differ and are selected to produce a large volume under investigation with high field homogeneity. The smallest inner radius $R_{if}$ of the field-shaping device 3 is 0.1558 m and represents the inner radius of the overall magnet configuration 4. The field-shaping device 3 therefore has a maximum extension in the radial direction (wall thickness) of 0.0496 m. The iron rings are magnetized by the strong magnetic field of approximately 6.5 T generated by the main field coil 1 and the shielding coil 2 to their saturation magnetization in the axial direction, wherein the saturation magnetization is thereby 2.15 T.

In this case, both the main field coil 1 and the shielding coil 2 consist of commercial superconducting wire on the basis of a niobium titanium alloy, which is wound into the respective single winding chamber (not shown) of two supporting bodies. The field-shaping device 3 is thereby mounted to the radial inner side of the supporting body of the main field coil 1 and has, like the main field coil 1 and the shielding coil 2, a temperature of 4.2 K under operating conditions.

The magnet configuration M1 which is cooled to an operating temperature of 4.2 K is located in a cryostat (not shown) which surrounds the magnet configuration M1. The cryostat has a room temperature bore which has an inner diameter of approximately 0.3 m and surrounds the volume under investigation 4b at its center.

Comparison of the embodiments of the figure groups 1, 2, and 3

Figure 2A:
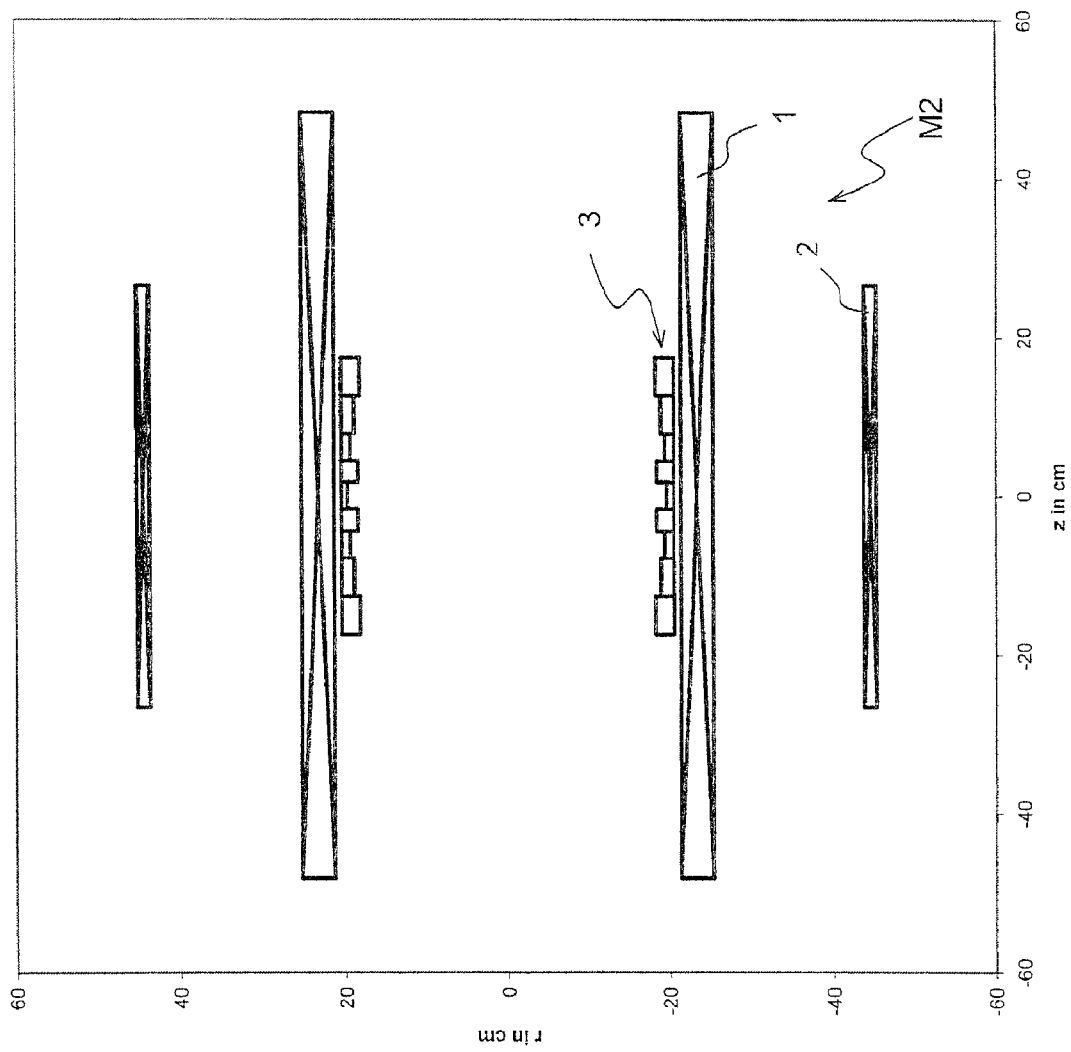

FIGS. 1a, 2a, 3a each show a cross-section through inventive magnet configurations M1, M2, M3. In their centers 4a, the magnet configurations have volumes under investigation 4b which are suited for magnetic resonance investigations with magnetic fields of a strength of $B_{ges}$=6.5 T. Each magnet configuration M1, M2, M3 consists of a main field coil 1, a shielding coil 2 and of a field-shaping device 3 of ferromagnetic material. Both the main field coils 1 and the shielding coils 2 are cooled down to a temperature of 4.2 K with liquid helium under operating conditions, and are wound from superconducting wire comprising the superconducting alloy niobium titanium. Both the main field coils 1 and the shielding coils 2 are unstructured solenoid coils in correspondence with the invention.

In this case, the main field coils 1 of the magnet configurations M1, M2, M3 have uniform inner radii $R_{ihaupt}$=21.35 cm as well as uniform radial extensions $DR_{haupt}$=4 cm. The axial extensions $L_{haupt}$ of the main field coils 1 of the configurations M1, M2, M3 are different and selected in accordance with the invention, such that each relationship $L_{haupt}/R_{ihaupt}$ is slightly above the specified and preferred values of 3.5 or 4.5 or 5.5. The exact values and all further relevant geometrical and electrical data are shown in table 1.

TABLE 1

|  | M1 | M2 | M3 |
| --- | --- | --- | --- |
| $L_{haupt}$ in cm | 75 | 96.5 | 118 |
| $R_{ihaupt}$ in cm | 21.35 | 21.35 | 21.35 |
| $DR_{haupt}$ in cm | 4 | 4 | 4 |
| $J_{haupt}$ in A/mm$^2$ | 243.4 | 203.1 | 179.4 |
| $L_{haupt}/R_{ihaupt}$ | 3.51 | 4.52 | 5.53 |
| $L_{abs}$ in cm | 42 | 62 | 81 |
| $R_{abs}$ in cm | 38.16 | 43.76 | 48.52 |
| $DR_{abs}$ in cm | 2.18 | 1.51 | 2.132 |
| $J_{abs}$ in A/mm$^2$ | −289.76 | −241.78 | −106.79 |
| $R_{af}$ in cm | 20.54 | 20.54 | 20.54 |
| $R_{if}$ in cm | 15.58 | 18.28 | 19.52 |
| dsv_z_5 ppm in cm | +/−6.8 | +/−8.9 | +/−9.8 |
| dsv_r_5 ppm in cm | 7.2 | 8.7 | 10.1 |
| z_5 gauss in m | +/−2.7 | +/−2.6 | +/−3.3 |
| r_5 gauss in m | 2.4 | 2.8 | 2.6 |

The axial extensions $L_{abs}$ of the shielding coils 2 in accordance with the invention are smaller than the axial extensions $L_{haupt}$ of the respective main field coils 1. The inner radii $R_{iabs}$, the axial extensions $DR_{abs}$, the lengths $L_{abs}$ of the shielding coils 2 and the current densities $J_{haupt}$ and $J_{abs}$ in the main field coils 1 or the shielding coils 2 are also shown in table 1. They are each selected such that the extensions of the magnetic stray fields with strengths above and including 5 gauss are minimum in the axial direction z_5 gauss and in the radial direction r_5 gauss and the joint magnetic field dependences generated in each case by the main field coil 1 and the shielding coil 2 along the z axis are flattened in accordance with the invention but have no minimum (in the area of the center 4a). These combined magnetic field dependences $B_{H+A}(z)$ of the main field coil 1 and the shielding coil 2 of the magnet configurations M1, M2, M3 along the z axis are shown in FIGS. 1b, 2b and respectively 3b. They represent highly inhomogeneous magnetic field dependences which are not suited for magnetic resonance investigations. However, the generating superconducting magnet coils which in the present case consist exclusively of an unstructured solenoid coil as main field coil 1 and an unstructured solenoid coil as shielding coil 2 represent the simplest feasible coil configuration for generating a magnetic field in the volume under investigation 4b which is moreover actively shielded and thereby has a stray field of minimum extension.

The main field coils 1 and the shielding coils 2 of the three magnet configurations M1, M2, M3 are each disposed on supporting bodies (not shown). These supporting bodies may e.g. be produced from aluminium, copper, or non-magnetic steel. In the present case, the field-shaping devices 3 are lathe work parts of magnetic steel which reaches a magnetization state of 2.15 T under operating conditions. An inventive design of the main field coils 1 and the associated shielding coils 2 enables geometrical formation of the field-shaping devices 3 such that the magnetic field dependences which are generated solely by the main field coils 1 and the shielding coils 2, which are inevitably inhomogeneous due to their simple shape, are each compensated for in the volumes under investigation 4b to obtain, in those volumes under investigation 4b, magnetic field dependences which are sufficiently homogeneous for NMR.

Figure 2D:
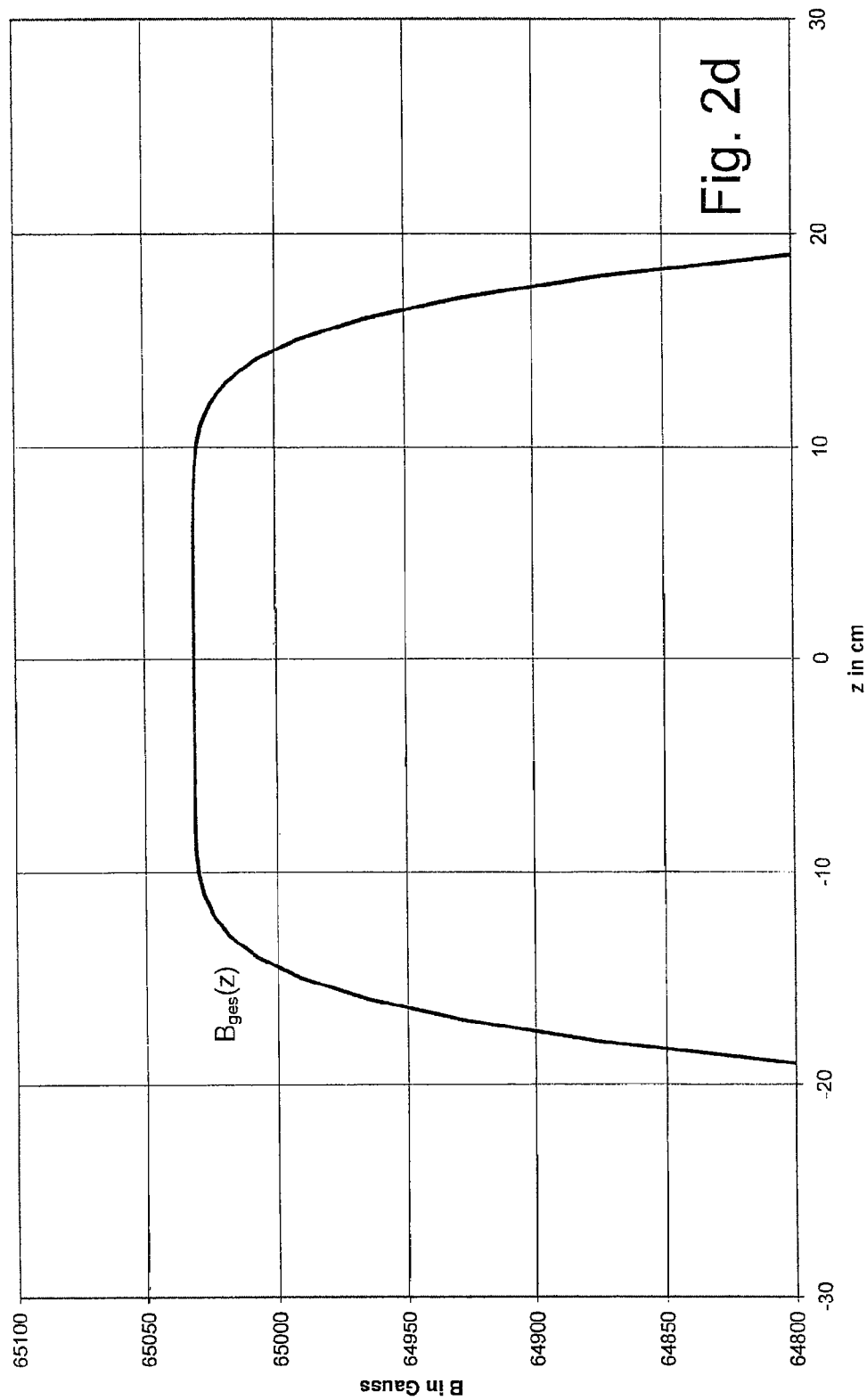
Figure 3D:
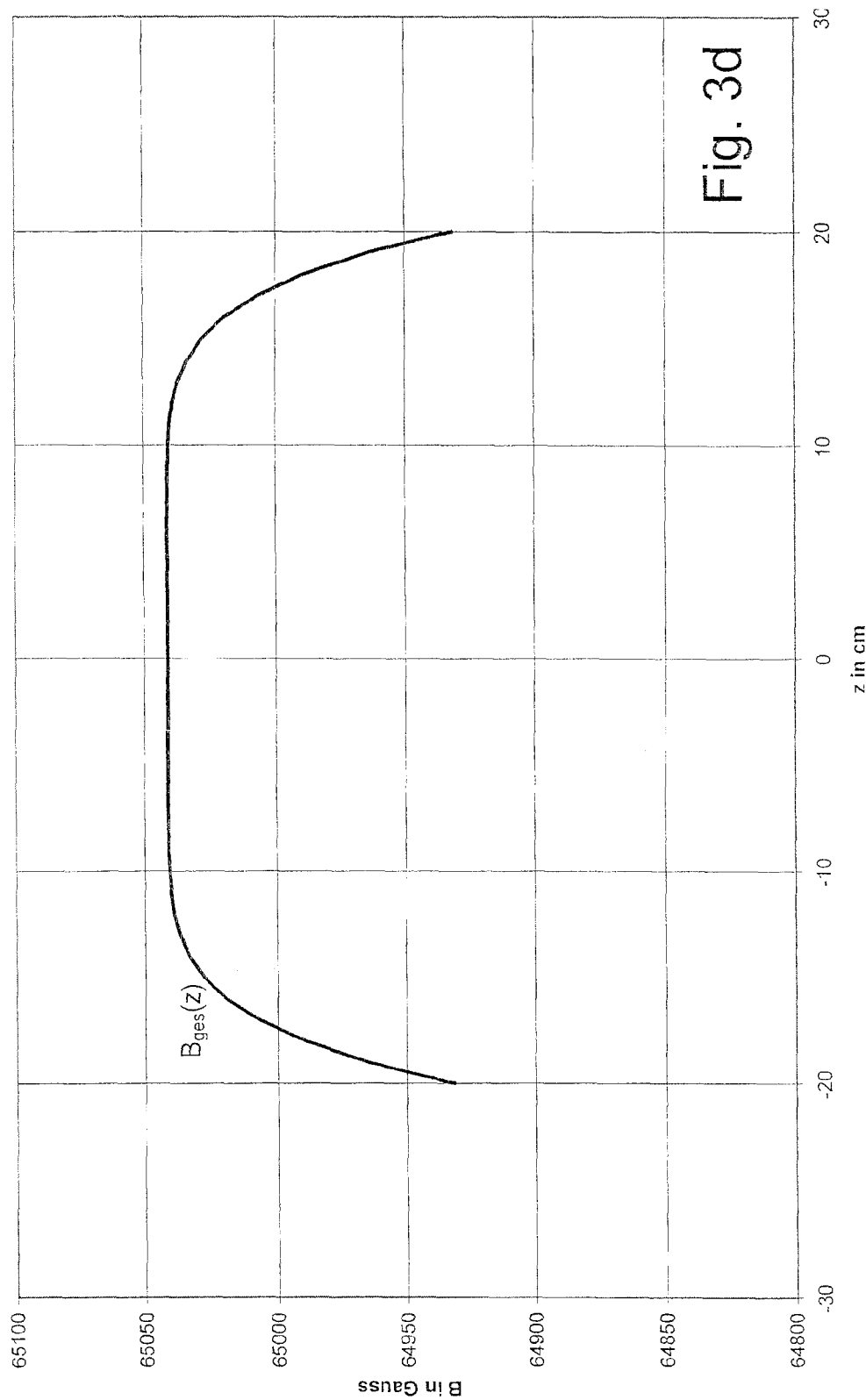

The radial dimensions of the field-shaping devices 3 of the magnet configurations M1, M2, M3 are illustrated in table 1. They each have a uniform outer radius $R_{af}$ and different inner radii $R_{if}$. The magnetic field dependences $B_F(z)$ generated by the field-shaping devices 3 of the magnet configurations M1, M2, M3 along the z axes are illustrated in FIGS. 1c, 2c, 3c. These are also highly inhomogeneous. However, by adding the inhomogeneous magnetic field dependences of the respective main field coils 1 and shielding coils 2 only (see FIG. 1b, FIG. 2b, FIG. 3b) one obtains the very homogeneous magnetic field dependences $B_{ges}(z)=B_{H+A+F}(z)$ of the overall magnet configurations M1, M2, M3 shown in FIGS. 1d, 2d, 3d.

Figure 4:
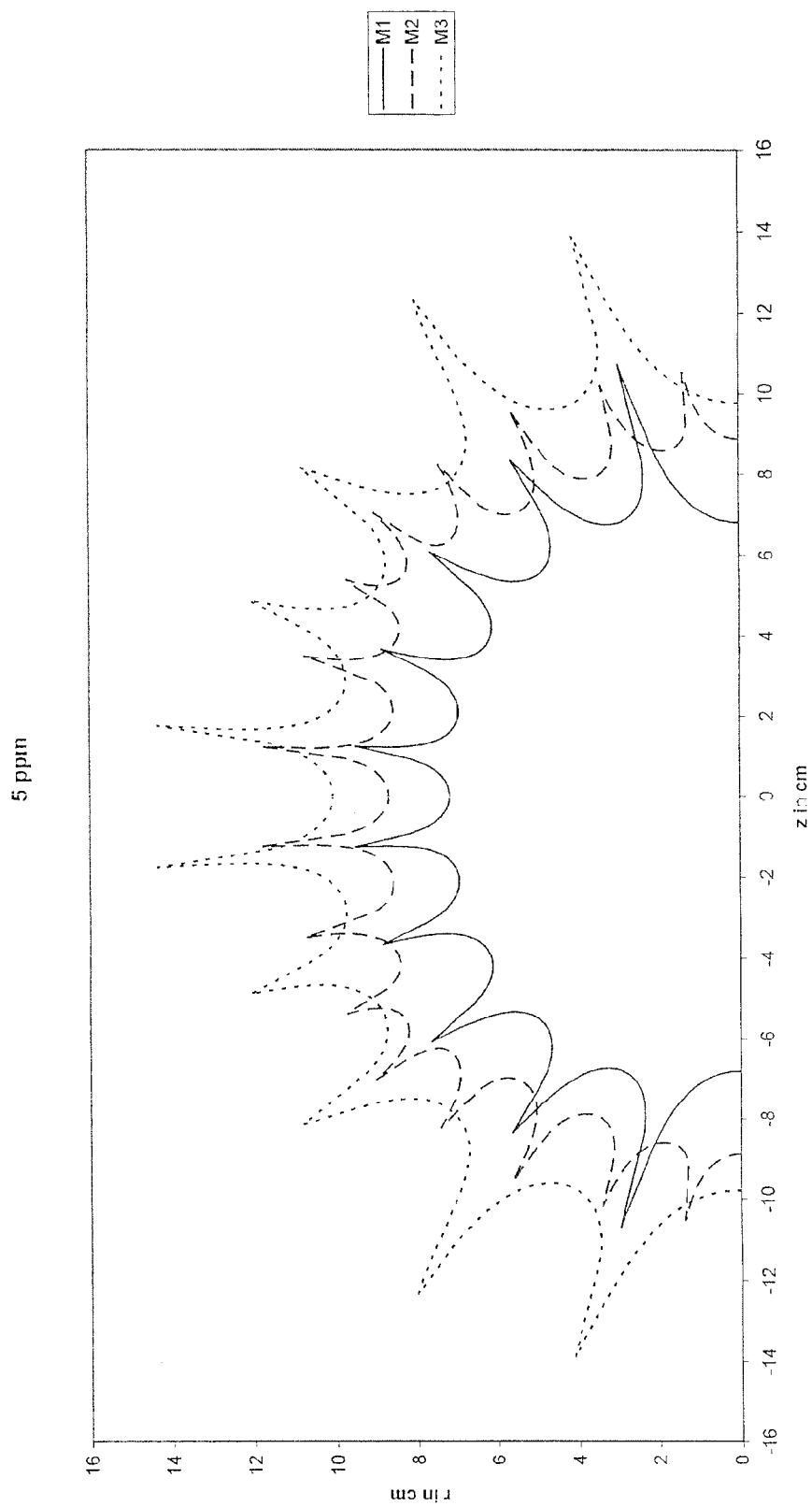
FIG. 4 shows the contour lines r(z) about the center of the volume under investigation in the geometric center of the respective magnet configurations according to FIGS. 1a, 2a, and 3a, within which the relative deviation of the magnetic field strength from the magnetic field strength in the center of the volume under investigation is smaller than +/−2.5 ppm (ppm: parts per million)

FIG. 4 shows the spatial extension of the areas of the magnet configurations M1, M2, M3 which are suited for magnetic resonance investigations, and in which the relative deviation of the magnetic field strength generated by the overall magnet configuration is smaller than +/−2.5 ppm (parts per million) compared to the field strength in the center. The axial extensions dsv_5 ppm_z and the radial extensions dsv_5 ppm_r of these areas around the centers are illustrated in table 1.

An evaluation of the three magnet configurations M1, M2, M3 shows that the configuration M3 which is characterized by a large ratio $L_{haupt}/R_{ihaupt}=5.53$ has a particularly large homogeneous volume with dimensions of dsv_5 ppm_z and dsv_5 ppm_r of approximately 10 cm. This configuration is moreover advantageous in that the inner radius $R_{if}$ of approximately 19.5 cm provides a particularly large axial access to the volume under investigation 4b. In the configuration M1 having a considerably smaller ratio $L_{haupt}/R_{ihaupt}=3.51$, the dimensions of the homogeneous volume dsv_5 ppm_z and dsv_5 ppm_r of approximately 7 cm are also more limited and axial access to the volume under investigation is also more limited by the smaller inner radius $R_{if}$ of the field-shaping device of approximately 15.8 cm.

Figure 5:
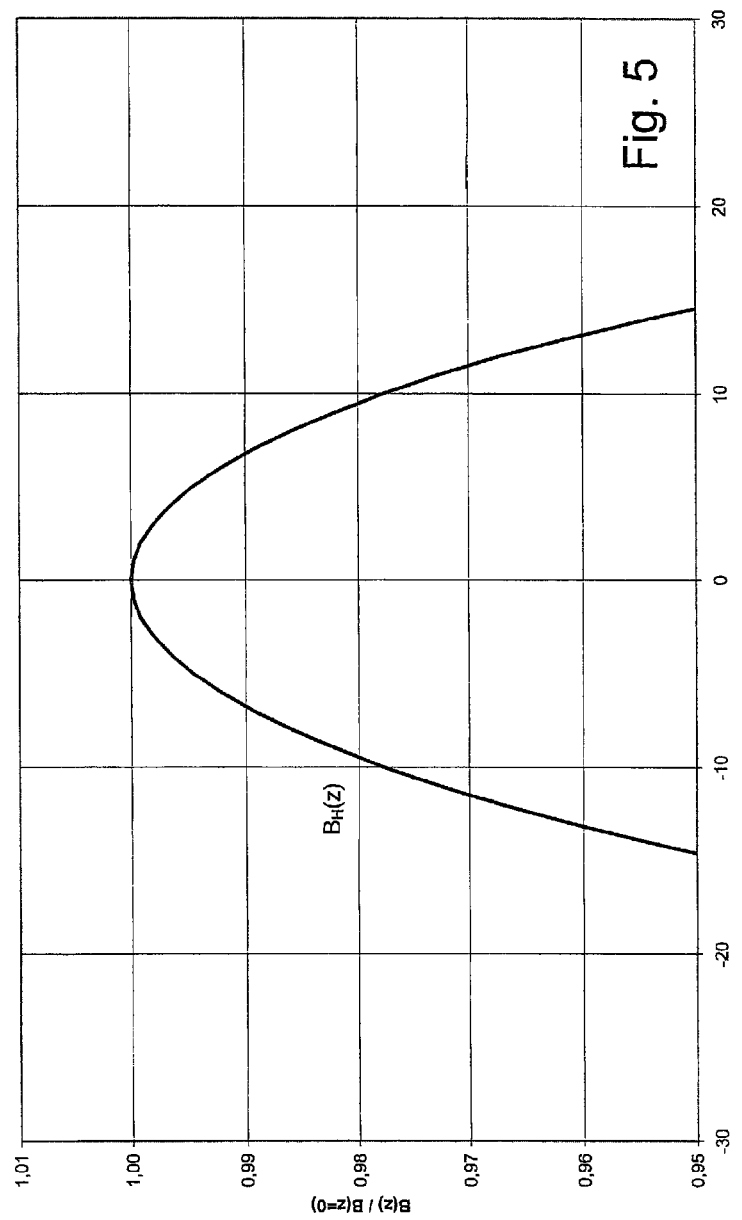
Figure 6:
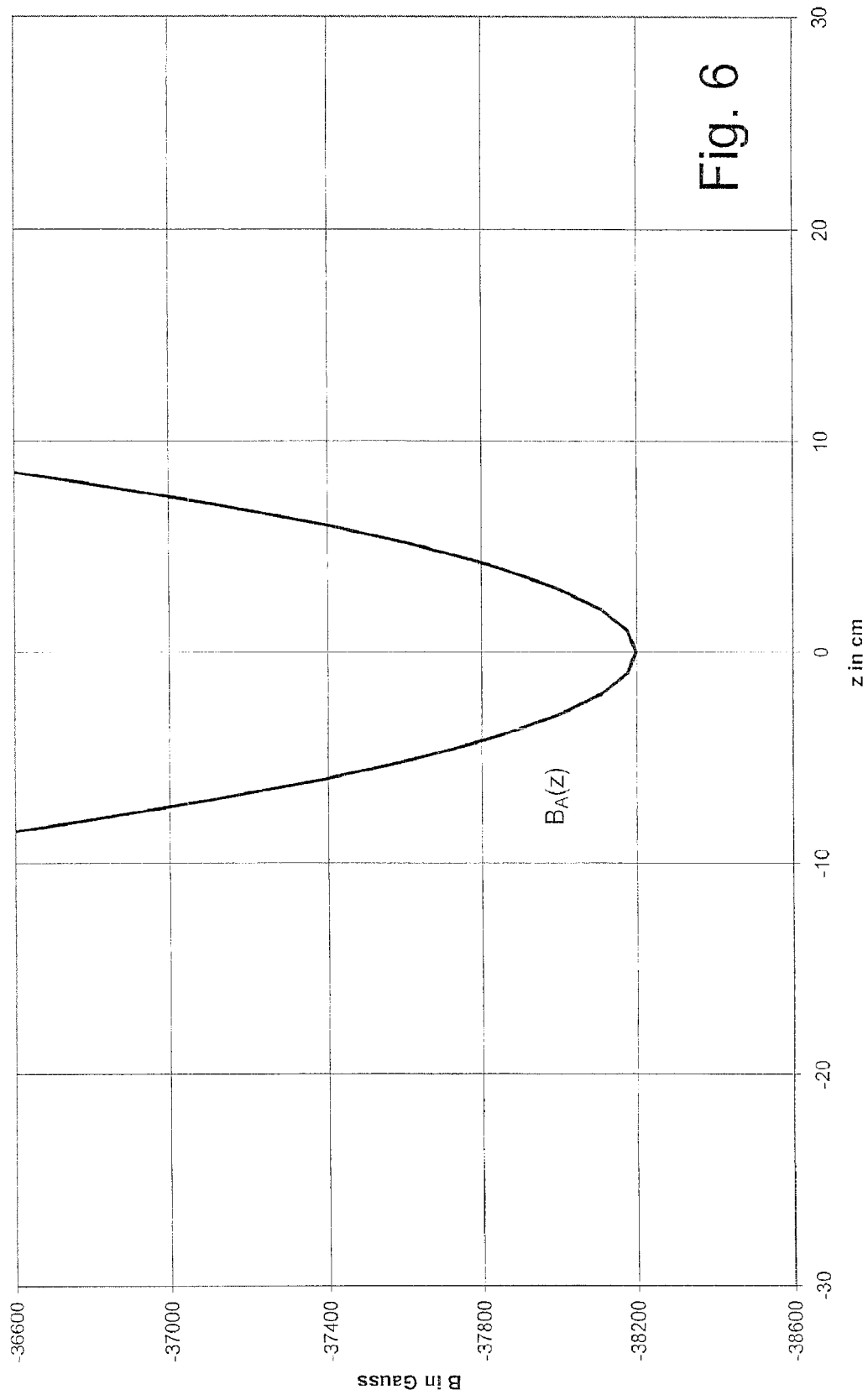

FIG. 5 shows the (standardized) magnetic field dependence $B_H(z)$ along the z axis which is generated only by the main field coil 1 of the magnet configuration M1 of FIG. 1a. This dependence has a pronounced maximum in the center at z=0, the curvature at z=0 is negative. FIG. 6 shows the (absolute) magnetic field dependence $B_A(z)$ along the axis, which is generated solely by the shielding coil of the magnet configuration M1, and has a pronounced minimum in the center at z=0. The curvature at z=0 is positive. The two magnetic field profiles are superposed to form the magnetic field dependence $B_{H+A}(z)$ shown in FIG. 1b which has a considerably less pronounced maximum compared to the magnetic field dependence $B_H(z)$.

Figure 7:
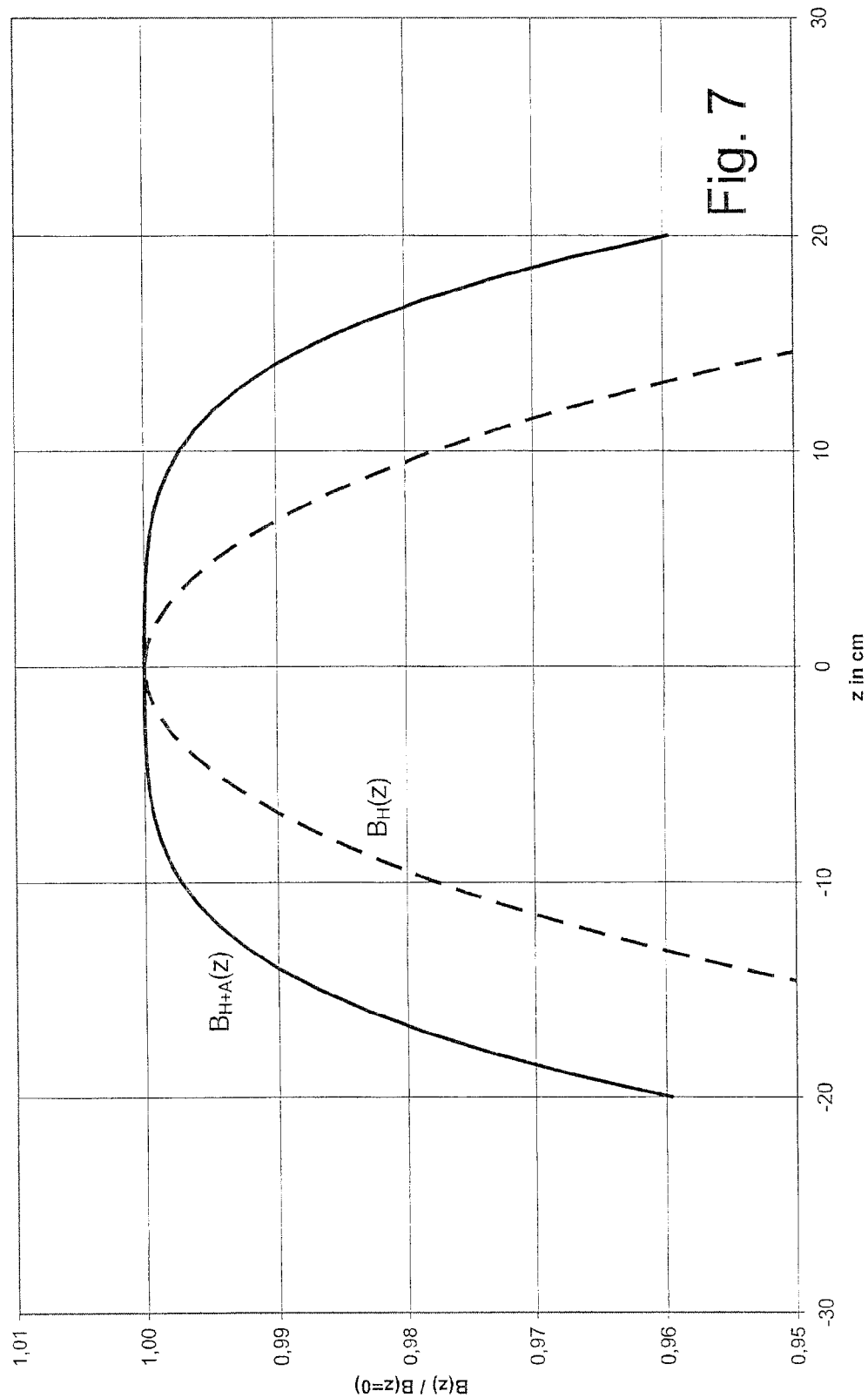
FIG. 7 shows the dependence of the standardized axial magnetic field profile (dashed line) generated by the main field coil of the magnet configuration according to FIG. 1a in comparison with the dependence of the standardized axial magnetic field profile (solid line) generated by the main field coil and the shielding coil.

By way of comparison, FIG. 7 shows the magnetic field dependences $B_H(z)$ $B_H(z=0)$ (dashed line) or $B_{H+A}(z)/B_{H+A}(z=0)$ (solid line) which are normalized to their respective maximum value $B_H(z=0)$ and $B_{H+A}(z=0)$, and are generated by the main field coil 1 alone or by the main field coil 1 and the shielding coil 2 together. FIG. 7 clearly shows the pronounced maximum of $B_H(z)$ and the considerably less pronounced maximum of $B_{H+A}(z)$. The superposition causes, in particular, that the area within which the magnetic field strength on the z axis varies by maximally 1% is doubled in its axial extension compared to $B_H(z)$ and $B_{H+A}(z)$. This flattening or widening or an even stronger flattening or widening of the maximum of the field profile of the main field coil 1 by the field of the shielding coil 2 is typical and preferred for the present invention (irrespective of the magnet configuration M1 taken as an example in this case).

The magnetic field dependence $B_{H+A}(z)$ is superposed on the magnetic field dependence $B_F(z)$ shown in FIG. 1c and generated solely by the field-shaping device of the magnet configuration M1 to form the magnetic field dependence $B_{H+A+F}(z)$ of the overall magnet configuration M1 shown in FIG. 1d, which is characterized by a great homogeneity.

Further embodiment with multi-part main and shielding coils

Figure 8:
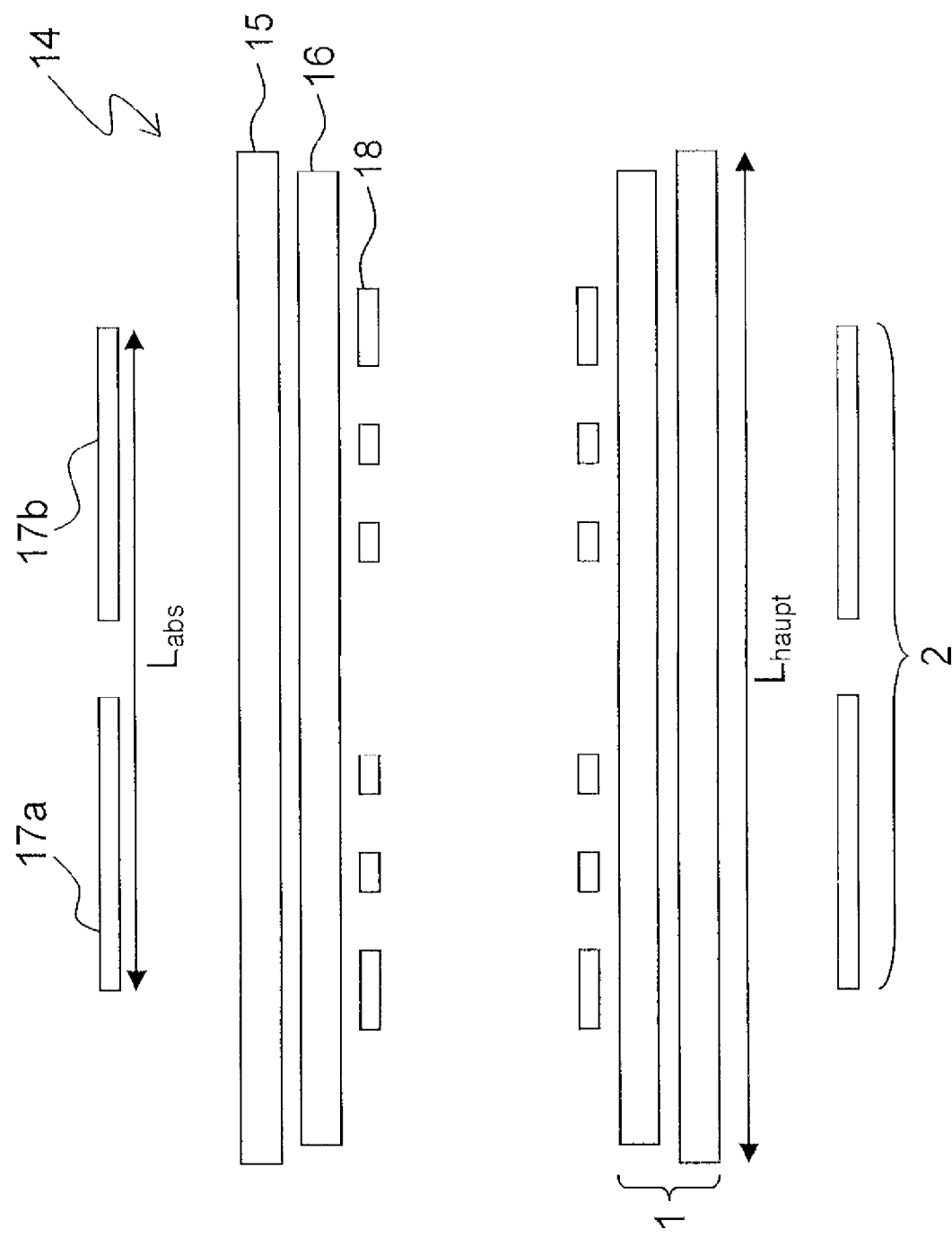
FIG. 8 shows a schematic view, not to be taken to scale, of the cross-section of a fourth embodiment of an inventive magnet configuration with several nested unstructured solenoid coils as main field coil and a two-part shielding coil with two unstructured symmetrically disposed solenoid coils.

FIG. 8 shows the schematic structure of another inventive magnet configuration 14 with two radially nested unstructured solenoid coils 15 and 16 as main field coil 1, through which a current flows in the same direction, and a structured solenoid coil through which a current flows in the opposite direction with two windings 17a, 17b, disposed next to each other, as shielding coil 2. The two windings 17a, 17b may also be realized in the form of respectively separate unstructured solenoid coils which are symmetrically disposed (with respect to a mirror plane disposed perpendicularly with respect to the axial direction in the center). A ferromagnetic field-shaping device 18 is also used in this case in order to produce an overall magnetic field of high homogeneity.

Embodiment with Additional Outer Shielding Body

Figure 9:
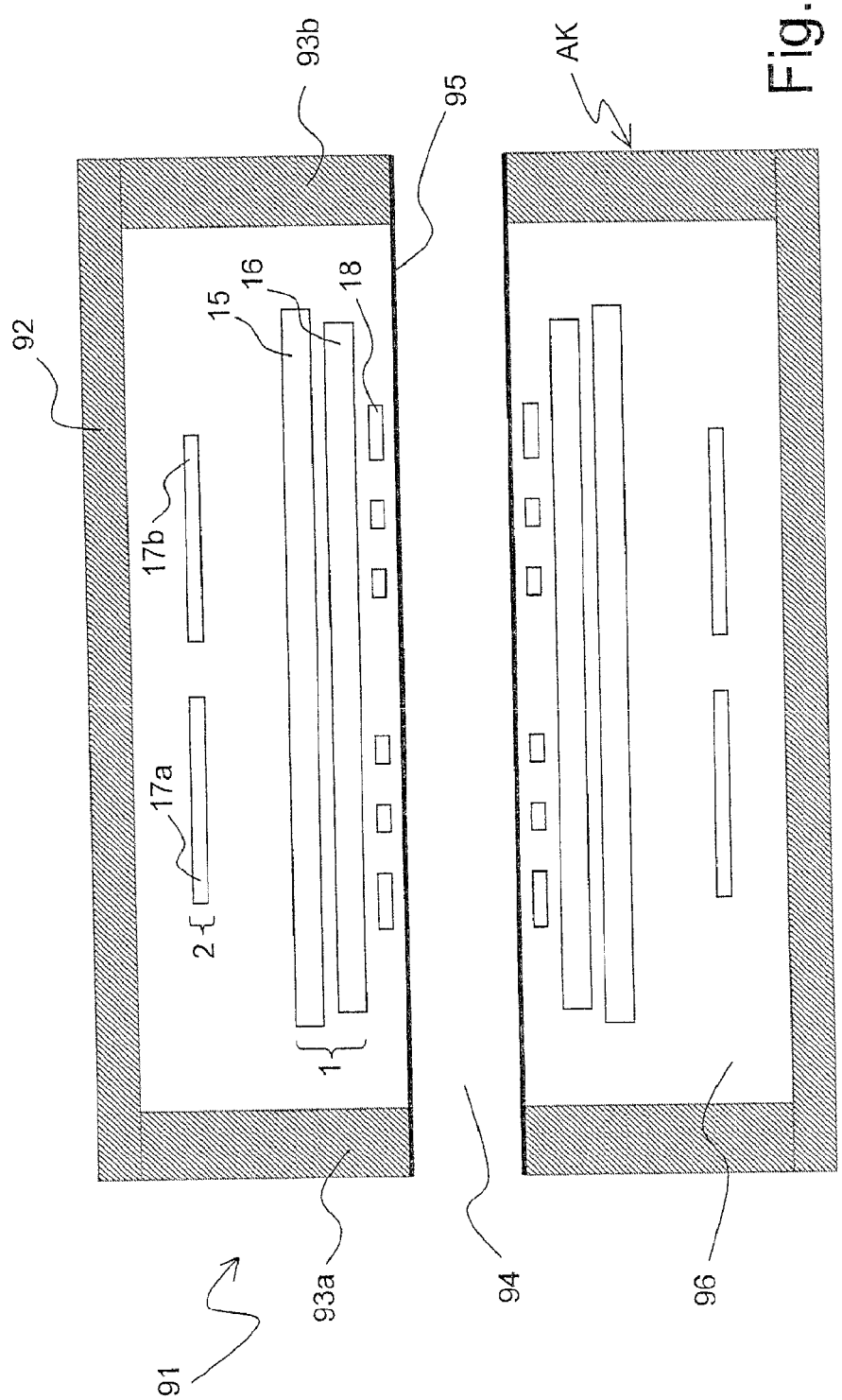
FIG. 9 shows a schematic view, not to be taken to scale, of the cross-section of a fifth embodiment of an inventive magnet configuration with several nested unstructured solenoid coils as main field coil and a two-part shielding coil with two unstructured symmetrically disposed solenoid coils and an additional shielding body of magnetically soft material which axially and radially surrounds this configuration.

FIG. 9 shows the schematic structure of another inventive magnet configuration 91 with two radially nested, unstructured solenoid coils 15 and 16, through which a current flows in the same direction, as main field coil 1, and a structured solenoid coil through which current flows in the opposite direction with two windings 17a, 17b, disposed next to one another as shielding coil 2 and an additional shielding body AK (shown in hatched lines) of magnetically soft material which axially and radially surrounds this configuration. The magnetically soft material may e.g. be magnetic steel. The shielding body AK comprises a radially outer cylindrical part 92 and two side plates 93a and 93b (each with an opening for the room temperature bore 94). This shielding body AK thereby forms, together with the inner pipe 95, the outer part of a cryostat 96 the so-called vacuum jacket. Further details of the cryostat 96 are not shown for reasons of simplicity.

The shielding body AK further reduces the extension of the magnetic stray field of the magnet configuration 91. In principle, the shielding body AK also influences the magnetic field dependence in the volume under investigation. This influence on the magnetic field dependence is, however, small due to the relatively large separation of all parts 92, 93a, 93b of the shielding body AK from the volume under investigation. A ferromagnetic field-shaping device 18 is also used in this case, which also takes into consideration the magnetic field dependence which is also influenced by the shielding body AK, and generates an overall magnetic field of high homogeneity.

We claim:

1. An actively shielded superconducting magnet configuration for generating a homogeneous magnetic field $B_0$ in a volume under investigation, the configuration comprising:

a radially inner superconducting main field coil, said main field coil being disposed in a rotationally symmetric manner about a z-axis, said main field coil consisting essentially of an unstructured solenoid coil or of several radially nested unstructured solenoid coils which are operated in a same direction;

a superconducting shielding coil, said superconducting shielding coil disposed coaxial to and radially outside of said main field coil, said shielding coil centered axially within ends of said main field coil and generating a magnetic filed which is directed opposite to a magnetic field generated by said main field coil, said shielding coil having a length $L_{abs}$ in an axial direction which is smaller than a length $L_{haupt}$ of said main field coil in said axial direction;

a ferromagnetic field-shaping device, said ferromagnetic field-shaping device disposed radially inside said main field coil, wherein $$\left.\frac{d^2}{dz^2}B_{H+A}(z)\right|_{z=0} \leq 0$$

applies for an axial magnetic field profile $B_{H+A}(z)$ generated by said main field coil and said shielding coil (2) during operation along said z-axis in a center at z=0, and $$\left.\frac{d^2}{dz^2}B_F(z)\right|_{z=0} \geq 0$$

applies for an axial magnetic field profile $B_F(z)$ generated by said ferromagnetic field-shaping device during operation along said z-axis in said center at z=0, wherein said z-axis is oriented in a positive direction of said $B_0$-field.

2. The magnet configuration of claim 1, wherein a curvature $$\frac{d^2}{dz^2}B_{H+A}(z)$$

in said center at z=0 is substantially equal to but of opposite direction to a curvature $$\frac{d^2}{dz^2}B_F(z).$$

3. The magnet configuration of claim 1, wherein a curvature $$\frac{d^2}{dz^2}B_{H+A}(z)$$

about said center at z=0 in a z range of between −a to a is substantially equal to but of opposite direction to said curvature $$\frac{d^2}{dz^2}B_F(z),$$

wherein 2a is a diameter of a measuring volume in said z direction.

4. The magnet configuration of claim 1, wherein the following applies for said length $L_{haupt}$ of said main field coil in said axial direction and an inner radius $R_{ihaupt}$ of said main field coil $L_{haupt} \geq 3.5*R_{ihaupt}$, $L_{haupt} \geq 4.5*R_{ihaupt}$ or $L_{haupt} \geq 5.5*R_{ihaupt}$.

5. The magnet configuration of claim 1, wherein said shielding coil consists essentially of an unstructured solenoid coil.

6. The magnet configuration of claim 1, wherein said main field coil consists essentially of only one unstructured solenoid coil.

7. The magnet configuration of claim 1, wherein said axial magnetic field profile $B_{H+A}(z)$ generated by said main field coil and said shielding coil during operation decreases monotonically along said z-axis on both sides of said center.

8. The magnet of claim 1, wherein said axial magnetic field profile $B_{H+A}(z)$ generated by said main field coil and said shielding coil during operation varies along said z-axis within the volume under investigation by maximally 500 ppm or maximally 100 ppm.

9. The magnet configuration of claim 1, wherein said main field coil and said shielding coil are electrically connected in series.

10. The magnet configuration of claim 9, further comprising a superconducting switch for short-circuiting an electrical circuit formed by said main field coil and said shielding coil.

11. The magnet configuration of claim 1, wherein the magnet configuration is disposed, structured and dimensioned for generating the homogeneous magnetic field in the volume under investigation with a field strength of $B_{ges} \geq 6$ Tesla or of $B_{ges} \geq 9$ Tesla.

12. The magnet configuration of claim 1, wherein an inner radius $R_{if}$ of said field-shaping device is $R_{if} \geq 80$ mm or $R_{if} \geq 300$ mm.

13. The magnet configuration of claim 1, wherein $$\frac{d^2}{dz^2}B_H(z) < 2\frac{d^2}{dz^2}B_{H+A} \leq 0$$

for said magnetic field profile $B_H(z)$ generated solely by said main field coil and for said axial magnetic field profile $B_{H+A}(z)$ generated by said main field coil and said shielding coil during operation along said z-axis in said center at z=0.

14. The magnet configuration of claim 1, further comprising a ferromagnetic shielding body which radially and axially surrounds said main field coil and said shielding coil.

15. The magnet configuration of claim 1, further comprising a cryostat within which said field-shaping device, said main field coil and said shielding coil are disposed.

16. The magnet configuration of claim 1, further comprising a cryostat having a room temperature bore within which said field-shaping device is disposed, wherein said main field coil and said shielding coil are disposed in said cryostat.

17. The magnet configuration of claim 1, further comprising a cryostat having a room temperature bore within which said field-shaping device is partially disposed, said field-shaping device also being partially disposed inside said cryostat, wherein said main field coil and said shielding coil are also disposed in said cryostat.

18. The magnet configuration of claim 14, wherein said field-shaping device is additionally designed to compensate for field inhomogeneities which are generated by production tolerances of said main field coil, said shielding coil and/or said ferromagnetic shielding body.

19. A magnetic resonance tomograph having the magnet configuration of claim 1.

20. A nuclear magnetic resonance spectrometer having the magnet configuration of claim 1.

21. An ion cyclotron resonance mass spectrometer having the magnet configuration of claim 1.

* * * * *